United States Patent
Lin et al.

(10) Patent No.: US 10,108,490 B1
(45) Date of Patent: Oct. 23, 2018

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Yu-Hsiang Lin, Yunlin County (TW); Shao-Wei Yen, Kaohsiung (TW); Cheng-Che Yang, New Taipei (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/604,661

(22) Filed: May 25, 2017

(30) Foreign Application Priority Data

Apr. 6, 2017 (TW) .............................. 106111497 A

(51) Int. Cl.
*G06F 11/10* (2006.01)
*G06F 3/06* (2006.01)
*G11C 29/52* (2006.01)

(52) U.S. Cl.
CPC ........ *G06F 11/1068* (2013.01); *G06F 3/0619* (2013.01); *G06F 3/0659* (2013.01); *G06F 3/0679* (2013.01); *G11C 29/52* (2013.01)

(58) Field of Classification Search
CPC .. G06F 11/1068; G06F 3/0619; G06F 3/0659; G06F 3/0679; G11C 29/52
See application file for complete search history.

(56) References Cited

U.S. PATENT DOCUMENTS

| | | | |
|---|---|---|---|
| 8,935,600 B1* | 1/2015 | Varnica | H03M 13/2957 714/759 |
| 9,891,991 B2* | 2/2018 | Lin | G06F 11/1068 |
| 2011/0083060 A1* | 4/2011 | Sakurada | G11C 11/5642 714/763 |
| 2013/0077400 A1* | 3/2013 | Sakurada | G11C 11/5642 365/185.03 |
| 2015/0186212 A1* | 7/2015 | Lin | G06F 11/1072 714/764 |
| 2015/0220391 A1* | 8/2015 | Chilappagari | G06F 11/1048 714/764 |
| 2017/0242748 A1* | 8/2017 | Lin | G06F 11/1068 |
| 2018/0013445 A1* | 1/2018 | Hsiao | H03M 13/1128 |

* cited by examiner

*Primary Examiner* — Kyle Vallecillo
(74) *Attorney, Agent, or Firm* — JCIPRNET

(57) ABSTRACT

A decoding method, a memory storage device and a memory control circuit unit. The method includes: reading a plurality of bits from a plurality of first memory cells; performing a first decoding operation on the bits according to first reliability information; and performing a second decoding operation on the bits according to second reliability information if the first decoding operation fails and meets a default condition, and the second reliability information is different from the first reliability information, and a correction ability of the second reliability information for a first type error of the bits is higher than a correction ability of the first reliability information for the first type error. In addition, the first type error is generated by performing a specific programming operation on the first memory cells based on error data.

25 Claims, 16 Drawing Sheets

404

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106111497, filed on Apr. 6, 2017. The entirety of the above-mentioned patent application is hereby incorporated by reference herein and made a part of this specification.

BACKGROUND

Technical Field

The invention relates to a decoding technology, and more particularly, to a decoding method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

There are various memory controllers configured with an error checking and correcting circuit. The error checking and correcting circuit is configured to perform an error checking and correction on data read from rewritable non-volatile memory module. However, based on the existing error checking and correction mechanism, it is not easy to locate errors of specific types (e.g., errors caused by repeatedly writing or moving data in the rewritable non-volatile memory module), and thus a probability of decoding failure increases.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a decoding method, a memory storage device and a memory control circuit unit, which are capable of improving a decoding efficiency.

An exemplary embodiment of the invention provides a decoding method, which is used for a rewritable non-volatile memory module including a plurality of memory cells. The memory cells include a plurality of first memory cells. Each memory cell among the first memory cells stores a first data bit and a second data bit. A bit value of the first data bit corresponds to a programming result of a first programming operation. A bit value of the second data bit corresponds to a programming result of a second programming operation. The second programming operation is performed based on the programming result of the first programming operation. The decoding method includes: sending a first read command sequence configured to instruct reading a plurality of bits from the first memory cells; performing a first decoding operation on the bits according to first reliability information; and performing a second decoding operation on the bits according to second reliability information if the first decoding operation fails and the first decoding operation meets a default condition. The second reliability information is different from the first reliability information, and a correction ability of the second reliability information for a first type error of the bits is higher than a correction ability of the first reliability information for the first type error. The first type error is generated by performing the second programming operation on the first memory cells based on error data.

Another exemplary embodiment of the invention provides a memory storage device, which includes a connection interface unit, a rewritable non-volatile memory module and a memory control circuit unit. The connection interface unit is configured to couple to a host system. The rewritable non-volatile memory module includes a plurality of memory cells. The memory control circuit unit is coupled to the connection interface unit and the rewritable non-volatile memory module. The memory cells include a plurality of first memory cells. Each memory cell among the first memory cells stores a first data bit and a second data bit. A bit value of the first data bit corresponds to a programming result of a first programming operation. A bit value of the second data bit corresponds to a programming result of a second programming operation, and the second programming operation is performed based on the programming result of the first programming operation. The memory control circuit unit is configured to send a first read command sequence configured to instruct reading a plurality of bits from the first memory cells. The memory control circuit unit is further configured to perform a first decoding operation on the bits according to first reliability information. The memory control circuit unit is further configured to perform a second decoding operation on the bits according to second reliability information if the first decoding operation fails and the first decoding operation meets a default condition. The second reliability information is different from the first reliability information, and a correction ability of the second reliability information for a first type error of the bits is higher than a correction ability of the first reliability information for the first type error. The first type error is generated by performing the second programming operation on the first memory cells in the rewritable non-volatile memory module based on error data.

Another exemplary embodiment of the invention provides a memory control circuit unit, which is configured to control a rewritable non-volatile memory module comprising a plurality of memory cells. The memory control circuit unit includes a host interface, a memory interface, an error checking and correcting circuit, and a memory management circuit. The host interface is configured to couple to a host system. The memory interface is configured to couple to a rewritable non-volatile memory module. The memory management circuit is coupled to the host interface, the memory interface and the error checking and correcting circuit. The memory cells include a plurality of first memory cells. Each memory cell among the first memory cells stores a first data bit and a second data bit. A bit value of the first data bit corresponds to a programming result of a first programming operation. A bit value of the second data bit corresponds to a programming result of a second programming operation, and the second programming operation is performed based on the programming result of the first programming operation. The memory management circuit is configured to send a first read command sequence configured to instruct reading a plurality of bits from the first memory cells. The error checking and correcting circuit is configured to perform a first decoding operation on the bits according to first reliability information. The error checking and correcting circuit is further configured to perform a second decoding operation on the bits according to second reliability information if the first decoding operation fails and the first decoding operation meets a default condition. The second reliability information is different from the first reliability information, and a correction ability of the second reliability information for a first type error of the bits is higher than a correction ability of the first reliability information for the first type error. The first type error is generated by performing the second programming operation on the first memory cells in the rewritable non-volatile memory module based on error data.

Based on the above, after the bits are read from the first memory cells, the first decoding operation is performed on the bits according to the first reliability information. If the first decoding operation fails and meets the default condition, it means that error of specific type may exist in these bits. For example, the error of the specific type may include the first type error, which is generated by performing programming operation on the first memory cells based on error data. Accordingly, the second decoding operation is then performed on the bits according to the second reliability information, where the second reliability information is different from the first reliability information. In particular, the correction ability of the second reliability information for the first type error is higher than the correction ability of the first reliability information for the first type error. As a result, the decoding efficiency can be improved.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
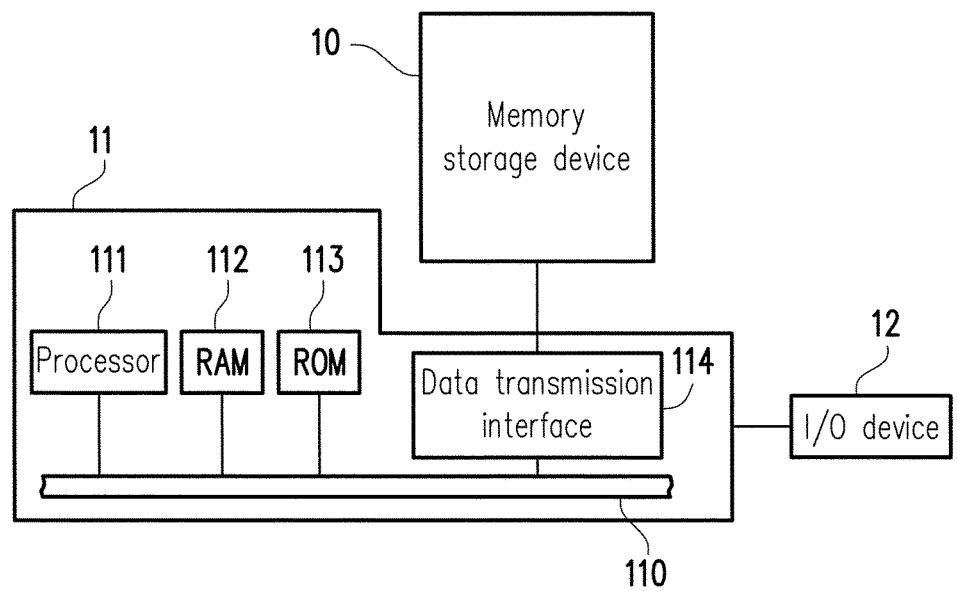
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
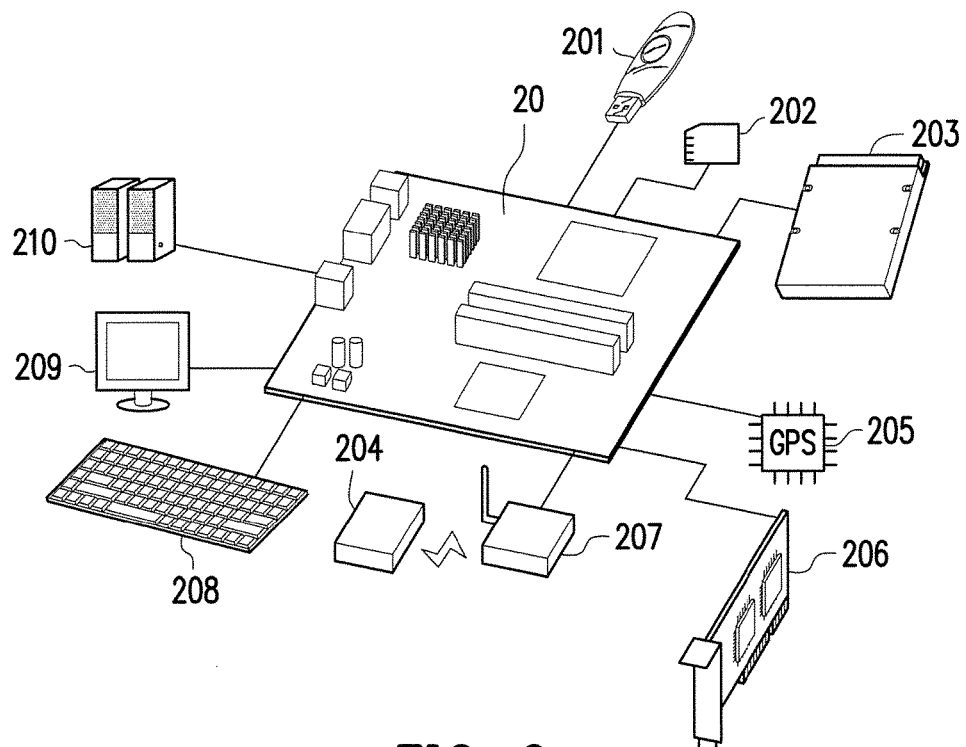
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention. Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
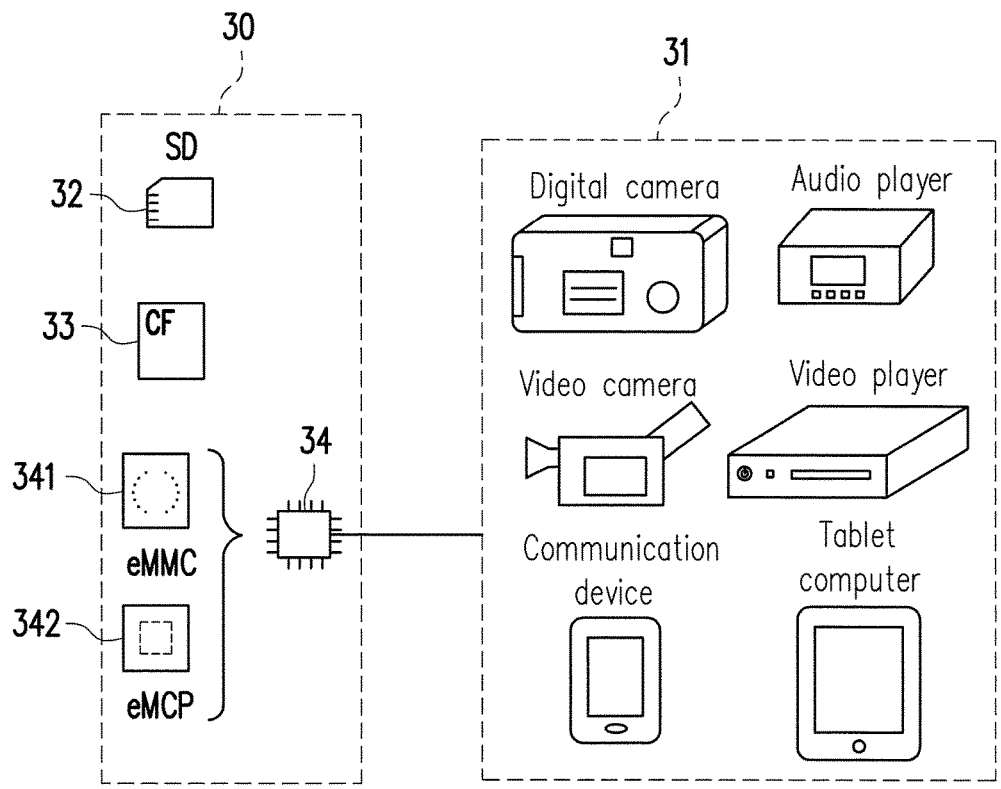
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiments, nonetheless, FIG. 3 is a schematic diagram illustrating a host system and a memory storage device according to another exemplary embodiment of the invention. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
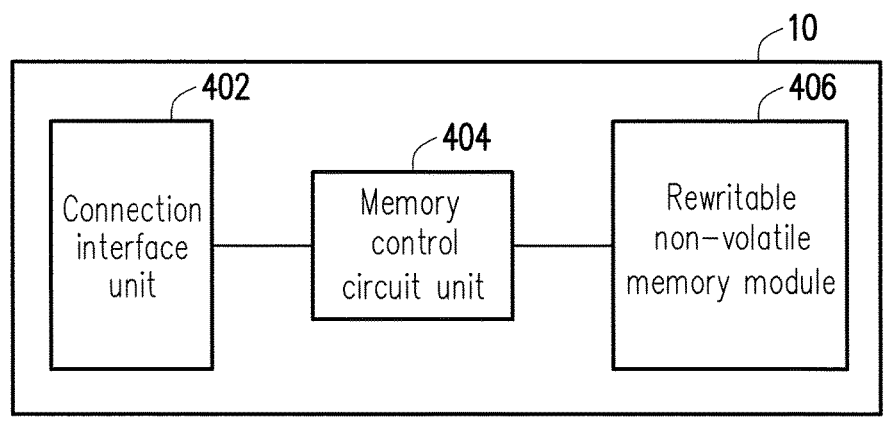
FIG. 4 is a schematic block diagram illustrating a memory storage device according to an exemplary embodiment of the invention.

FIG. 4 is a schematic block diagram illustrating a memory storage device according to an exemplary embodiment of the invention. Referring to FIG. 4, the memory storage device 10 includes a connection interface unit 402, a memory control circuit unit 404 and a rewritable non-volatile memory module 406.

The connection interface unit 402 is configured to couple to the memory storage device 10 to the host system 11. In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". Each of the memory cells in the rewritable non-volatile memory module 406 has a plurality of storage states depended on changes in the threshold voltage. The storage state to which the memory cell belongs may be determined by applying a read voltage to the memory cell, so as to obtain the one or more bits stored in the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store more than one bit, the physical programming units on the same word line can be at least classified into a lower physical programming unit and an upper physical programming unit. For example, in an exemplary embodiment, a least significant bit (LSB) of one memory cell belongs to the lower physical programming unit, and a most significant bit (MSB) of one memory cell belongs to the upper physical programming unit. Nonetheless, in another exemplary embodiment, the least significant bit (LSB) of one memory cell may also belong to the upper physical programming unit, and the most significant bit (MSB) of one memory cell may also belong to the lower physical programming unit. In general, in the MLC NAND flash memory, a writing speed of the lower physical programming unit is faster than a writing speed of the upper physical programming unit, and/or a reliability of the lower physical programming unit is higher than a reliability of the upper physical programming unit.

In the present exemplary embodiment, the physical programming unit is the minimum unit for programming. That is, the physical programming unit is the minimum unit for writing data. For example, the physical programming unit is a physical page or a physical sector. When a physical programming unit is the physical page, these physical programming units usually include a data bit area and a redundancy bit area. The data bit area includes multiple physical sectors configured to store user data, and the redundant bit area is configured to store system data (e.g., management data such as an error correcting code, etc.). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 5:
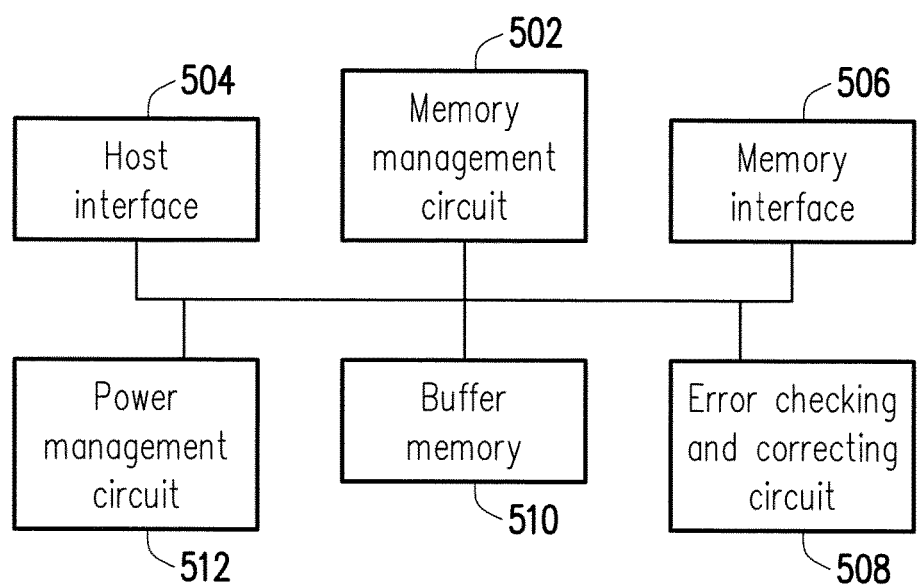
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention. Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands and the control commands are executed to perform various operations such as writing, reading and erasing data during operation of the memory storage device 10. Hereinafter, operation of the memory management circuit 502 is described as equivalent to describe operation of the memory control circuit unit 404.

In the present exemplary embodiment, the control commands of the memory management circuit 502 are implemented in form of firmware. For example, the memory management circuit 502 has a microprocessor unit (not illustrated) and a ROM (not illustrated), and the control commands are burned into the ROM. During operation of the memory storage device 10, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the ROM (not illustrated) and a RAM (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further give command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 via the host interface 504. In the present exemplary embodiment, the host interface 504 is compatible with the SATA standard. Nevertheless, it should be understood that the invention is not limited to the above. The host interface 504 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and other command sequences for instructing to perform various memory operations (e.g., changing read voltage levels or performing a garbage collection procedure). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

In an exemplary embodiment, the memory control circuit unit 404 further includes an error checking and correcting circuit 508, a buffer memory 510 and a power management circuit 512.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

In the present exemplary embodiment, a low density parity-check code (LDPC code) is used by the error checking and correcting circuit 508. However, in another exemplary embodiment, the error checking and correcting circuit 508 may also use a BCH code, a convolutional code, a turbo code, etc., which are not particularly limited in the invention.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

Figure 6:
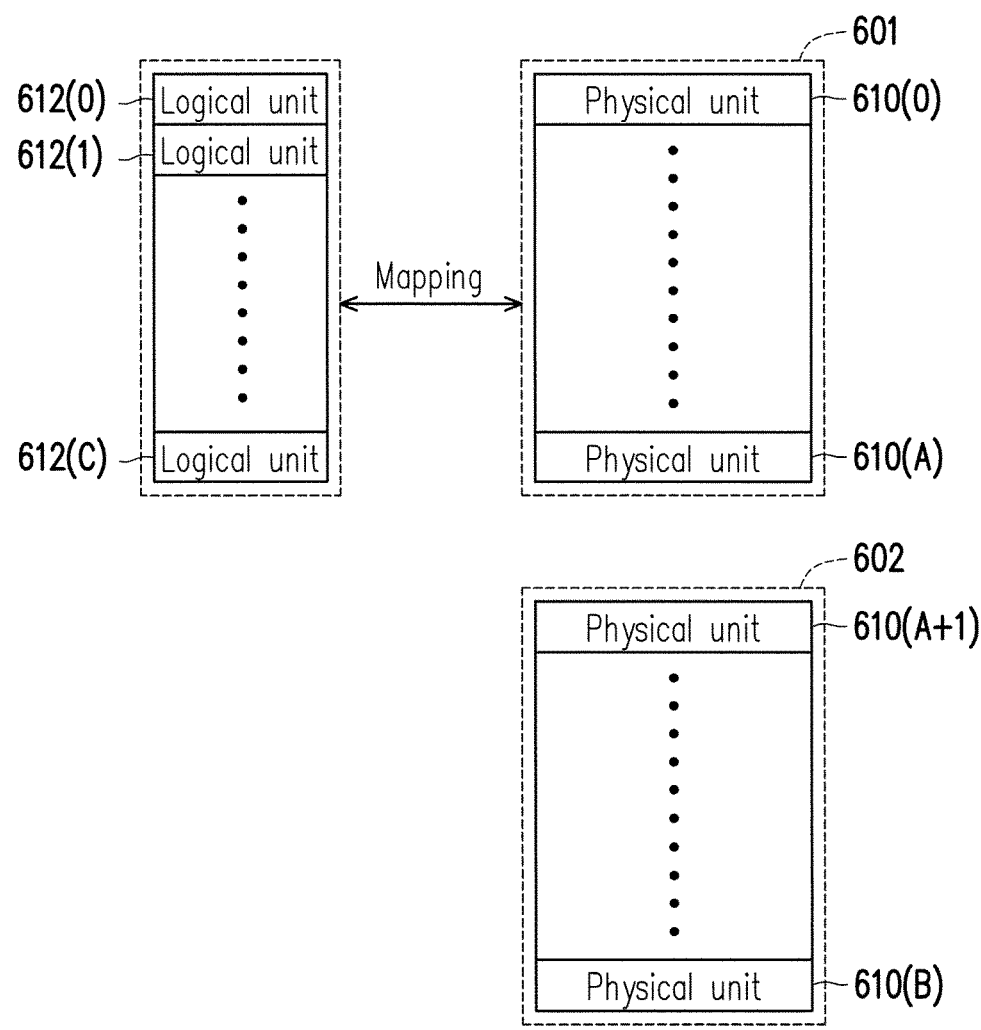
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention. Referring to FIG. 6, the memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from one specific physical unit includes too many errors and thus cannot be corrected, the specific physical unit is treated as a damaged physical unit. It is noted that, if there are no available physical erasing units in the storage area 602, the memory management circuit 502 may pronounce that the memory storage device 10 is in a write protect state so data can no longer be written thereto.

In the present exemplary embodiment, each physical unit refers to one physical erasing unit. However, in another exemplary embodiment, one physical unit may also refer to one physical address, one physical programming unit, or a composition of a plurality of continuous or discontinuous physical addresses. The memory management circuit 502 assigns logical units 612 (0) to 612(C) for mapping to the physical units 610(0) to 610(A) in the storage area 601. In the present exemplary embodiment, each logical unit refers to one physical address. However, in another exemplary embodiment, each logical unit may also refer to one logical programming unit, one logical erasing unit or a composition of a plurality of continuous or discontinuous logical addresses. In addition, each of the logical units 612(0) to 612(C) may also be mapped to one or more physical units.

In the present exemplary embodiment, the memory management circuit 502 records a mapping relation (also known as a logical-physical address mapping relation) between the logical units and the physical units into at least one logical-physical address mapping table. When the host system 11 intends to read data from the memory storage device 10 or write data into the memory storage device 10, the memory management circuit 502 can perform a data accessing operation on the memory storage device 10 according to the logical-physical address mapping table.

It is noted that in the following description, some terms may be replaced with corresponding abbreviations for ease of reading (see Table 1).

TABLE 1

| | |
|---|---|
| rewritable non-volatile memory module | RNVM module |
| physical programming unit | PPU |
| memory management circuit | MMC |
| error checking and correcting circuit | ECCC |
| read voltage level | RVL |

Figure 7:
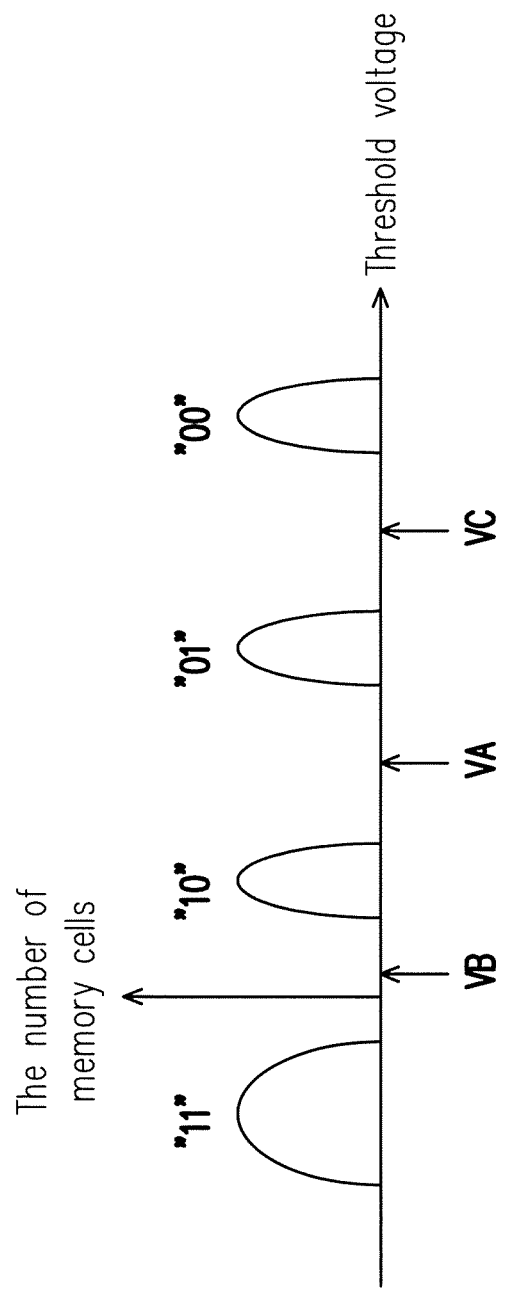
FIG. 7 is a schematic diagram illustrating threshold voltage distributions of memory cells according to an exemplary embodiment of the invention.
Figure 8:
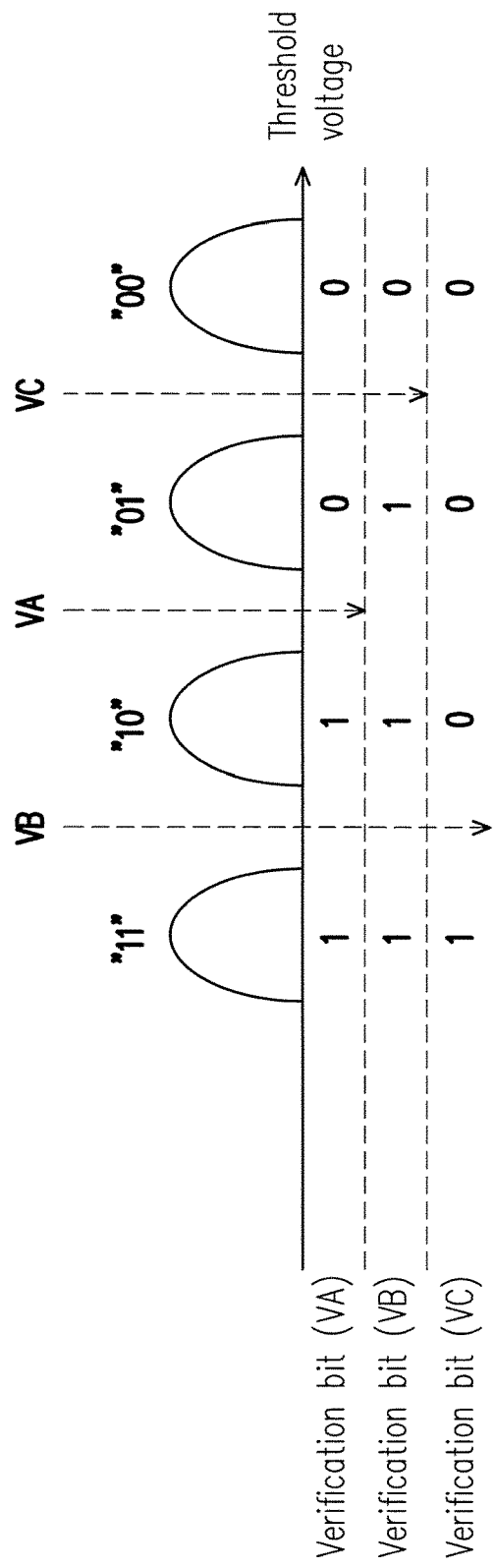
FIG. 8 illustrates a schematic diagram for reading data from memory cells according to an exemplary embodiment of the invention.

FIG. 7 is a schematic diagram illustrating threshold voltage distributions of memory cells according to an exemplary embodiment of the invention. FIG. 8 illustrates a schematic diagram for reading data from memory cells according to an exemplary embodiment of the invention. Referring to FIG. 7 and FIG. 8 where the MLC NAND flash memory is used as an example, in which each of the memory cells has four storage states based on different threshold voltages, and the storage states represent bits "11", "10", "01" and "00", respectively. In other words, each storage state includes the LSB and the MSB. In the present exemplary embodiment, in each storage state, a first bit counted from the left is the LSB, and a second bit counted from the left is the MSB. Accordingly, in the present exemplary embodiment, each of the memory cells can store two bits. It should be understood that, the threshold voltages and the corresponding storage states as illustrated in the FIG. 7 are merely an example. In another exemplary embodiment, the threshold voltages and the corresponding storage states may also arranged as "11", "10", "00" and "01" according to the threshold voltage from small to large, or have other arrangements. In addition, in another exemplary embodiment, it can also be defined that the first bit counted from the left is the MSB, and the second bit counted from the left is the LSB.

In a reading operation for the memory cells, data stored in the memory cells is identified according whether a memory cell channel is turned on when a read voltage is applied to the control gate. Taking the MLC NAND flash memory for example, a verification bit (VA) is configured to indicate whether the memory cell channel is turned on when a read voltage VA is applied; a verification bit (VB) is configured to indicate whether the memory cell channel is turned on when a read voltage VB is applied; a verification bit (VC) is configured to indicate whether the memory cell channel is turned on when a read voltage VC is applied. Here, it is assumed that the corresponding memory cell channel is turned on when the verification bit is "1", and the corresponding memory cell channel is not turned on when the verification bit is "0". As shown in FIG. 8, which of the storage states is the memory cell currently in may be determined according to the verification bits (VA) to (VC), so as to obtain the stored bit.

Figure 9:
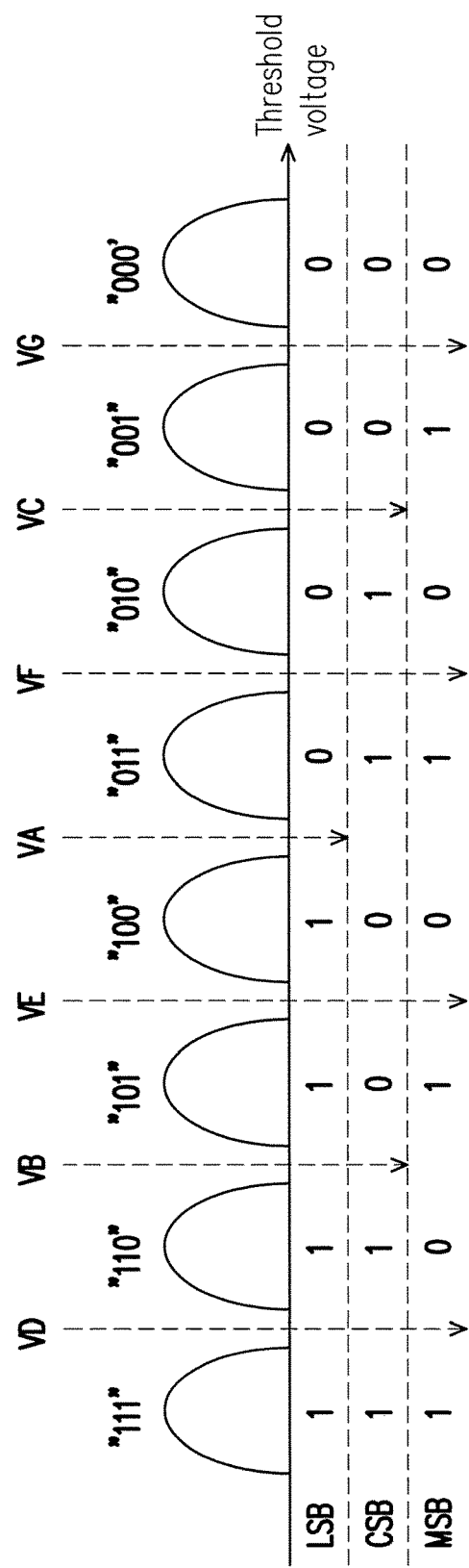
FIG. 9 illustrates a schematic diagram for reading data from memory cells according to another exemplary embodiment of the invention.

FIG. 9 illustrates a schematic diagram for reading data from memory cells according to another exemplary embodiment of the invention. With reference to FIG. 9, taking the TLC NAND flash memory for example, each storage state represents three bits stored by one memory cell. For example, in the present exemplary embodiment, each storage state includes the LSB as a first bit counted from the left, a CSB (Center Significant Bit) as a second bit counted from the left and the MSB as a third bit counted from the left. In the present exemplary embodiment, the memory cell includes eight storage states (i.e., "111", "110", "101", "100", "011", "010", "001" and "000") depended on different threshold voltages. The bits stored in one memory cell may be identified by applying the read voltages VA to VG to the control gate. Here, it is noted that, an arranging sequence of the eight storage states may be set based on designs of manufacturers rather than being limited by the invention. In addition, in another exemplary embodiment, one bit among the three bits stored by one memory cell being the LSB, the CSB or the MSB may be adjusted based on actual requirements.

It is noted that, for descriptive convenience, in the following exemplary embodiments, if one memory cell can store two bits, it is then assumed that a first bit counted from the left of the two bits is the LSB and belongs to the lower PPU and a second bit counted from the left is the MSB and belongs to the upper PPU. In addition, if one memory cell can store three bits, it is then assumed that a first bit counted from the left of the three bits is the LSB and belongs to the lower PPU, a second bit counted from the left is the CSB and belongs to a middle PPU and a third bit counted from the left is the MSB and belongs to the upper PPU.

In the low density parity code, a valid codeword is defined by using a parity check matrix. The parity check matrix is marked as a matrix H and a codeword is marked as CW hereinafter. According to Equation (1) below, if a result calculated by multiplying the parity check matrix H by the codeword C W is a zero vector, it indicates that the codeword C W is a valid codeword. Therein, an operator $\otimes$ represents a mod 2 matrix multiplication. In other words, a null space of the matrix H includes all the valid codewords. However, the content of the codeword C W is not particularly limited by the invention. For example, the codeword C W may also include the error correcting code or the error detecting code generated by using any algorithm.

$$H \otimes CW^T = 0 \tag{1}$$

Therein, a dimension of the matrix H is k-by-n, and a dimension of the codeword C W is 1-by-n. k and n are positive integers. The codeword C W includes message bits and parity bits, that is, the codeword C W may be expressed by [M P], in which a vector M is constituted by the message bits, and a vector P is constituted by the parity bits. A dimension of the vector M is 1-by-(n–k), and a dimension of the vector P is 1-by-k. Hereinafter, the message bits and the parity bits are collectively referred to as data bits. In other words, the codeword CW includes n data bits, where a length of the message bits is (n–k) bits, and a length of the parity bits is k bits. Namely, a code rate of the codeword CW is (n–k)/n.

In general, a generation matrix (hereinafter, marked as G) is used when encoding, so that any vector M can satisfy Equation (2) below. A dimension of the generation matrix G is (n–k)-by-n.

$$M \otimes G = [MP] = CW \tag{2}$$

Therein, the codeword C W generated by Equation (2) is the valid codeword. Therefore, Equation (2) may be substituted in Equation (1) to obtain Equation (3) below.

$$H \otimes G^T \otimes M^T = 0 \tag{3}$$

Since the vector M may be any vector, Equation (4) below can definitely be satisfied. In other words, after the parity check matrix H is decided, the corresponding generation matrix G may also be decided.

$$H \otimes G^T = 0 \tag{4}$$

When one codeword C W is to be decoded, a parity checking procedure is first performed on the data bits in the codeword by, for example, multiplying the parity check matrix H by the codeword C W to generate one vector (hereinafter, marked as S, as shown in Equation (5) below). If the vector S is a zero vector, the codeword C W may be directly outputted. If the vector S is not the zero vector, it indicates that the codeword CW is not the valid codeword.

$$H \otimes CW^T = S \tag{5}$$

A dimension of the vector S is k-by-1, in which each element is also known as a syndrome. If the codeword CW is not the valid codeword, the ECCC 508 may perform a decoding procedure (a.k.a. a decoding operation) attempting to correct errors (i.e., error bits) in the codeword C W.

Figure 10:
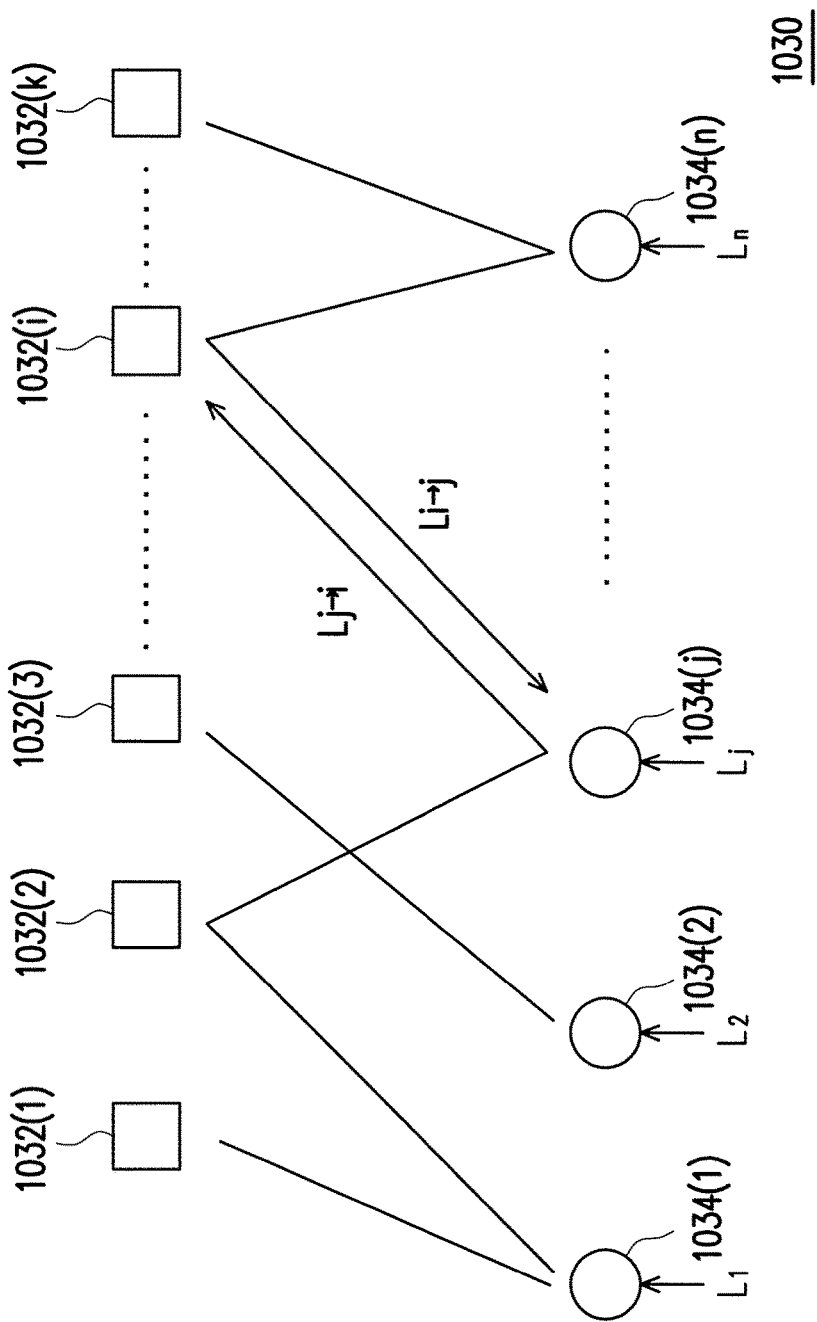
FIG. 10 is a schematic diagram illustrating a parity check matrix according to an exemplary embodiment of the invention.

FIG. 10 is a schematic diagram illustrating a parity check matrix according to an exemplary embodiment of the invention. With reference to FIG. 10, generally, the parity check matrix H may be represented by a bipartite graph 1030, which includes parity nodes 1032(1) to 1032(k) and message nodes 1034(1) to 1034(n). Each of the parity nodes 1032(1) to 1032(k) corresponds to one syndrome, and each of the message nodes 1034(1) to 1034(n) corresponds to one data bit. Correspondence relations between the data bits and the syndromes (i.e., connections between the message nodes 1034(1) to 1034(n) and the parity nodes 1032(1) to 1032(k)) are generated according to the parity check matrix H. Specifically, if an element at an $i^{th}$ row and a $j^{th}$ column in the parity check matrix H is 1, an $i^{th}$ parity node 1032(i) is connected to a $j^{th}$ message node 1034(j), where i and j are positive integers.

When the MMC 502 reads n data bits (for forming one codeword) from the RNVM module 406, the MMC 502 also obtains reliability information (a.k.a. channel reliability information) for each of the data bits. The reliability information is used to indicate a probability (or known as a reliance level) of the corresponding data bit being decoded into "1" or "0". In the bipartite graph 1030, the message nodes 1034(1) to 1034(n) also receive the corresponding reliability information. For instance, the message node 1034(1) may receive reliability information $L_1$ of a first data bit, and the message node 1034(j) may receive reliability information $L_j$ of a $j^{th}$ data bit.

The ECCC 508 performs the decoding operation according to a structure of the bipartite graph 1030 and the reliability information $L_1$ to $L_n$. For example, the decoding operation includes an iterative decoding. In the iterative decoding, the message nodes 1034(1) to 1034(n) calculate the reliability information for the parity nodes 1032(1) to 1032(k), and the parity nodes 1032(1) to 1032(k) also calculate the reliability information for the message nodes 1034(1) to 1034(n). The reliability information are transmitted along edges in the bipartite graph 1030. For example, what transmitted from the parity node 1032(i) to the message node 1034(j) is the reliability information $L_{i \to j}$, and what transmitted from the message node 1034(j) to the parity node 1032(i) is the reliability information $L_{j \to i}$. The reliability information is used to represent the probability (i.e., the reliance level) of one specific data bit being decoded into "1" or "0" as deemed by one node. For example, the reliability information $L_{j \to i}$ represents the reliance level (which may be positive or negative) of the $j^{th}$ data bit being decoded into "1" or "0" as deemed by the message node 1034(j), the reliability information $L_{i \to j}$ represents the reliance level of the $j^{th}$ data bit being decoded into "1" or "0" as deemed by the message node 1032(i). Further, the message nodes 1034(1) to 1034(n) and the parity nodes 1032(1) to 1032(k) calculate reliability information to be outputted according to the reliability information being inputted similar to calculate a conditional probability of one specific data bit being decoded into "1" or "0". Therefore, aforesaid process of transmitting the reliability information is also known as a belief propagation.

Based on different algorithms, different reliability information are calculated by the message nodes 1034(1) or 1034(n) and/or the parity nodes 1032(1) to 1032(k). For instance, the ECCC 508 can adopt algorithms including a Sum-Product Algorithm, a Min-Sum Algorithm, or a bit-flipping Algorithm, which are not particularly limited by the invention.

In each iteration of the iterative decoding, the message nodes 1034(1) to 1034(n) transmit the reliability information to the parity nodes 1032(1) to 1032(k), and the parity nodes 1032(1) to 1032(k) also transmit the reliability information to the message nodes 1034(1) to 1034(n). After each iteration, the message nodes 1034(1) to 1034(n) calculate the probability of each data bit being decoded into "1" or "0" according to the current reliability information. After the parity checking procedure is performed on the calculated data bits (e.g., by multiplying the codeword formed by data bit with the parity check matrix), whether the codeword is the valid codeword can be determined. If the generated codeword is the valid codeword, it means that the decoding succeeds, and the iteration decoding will stop. However, if the generated codeword is not the valid codeword, the next iteration may be performed. If an iteration count of the iterative decoding reaches one default value, it means that the decoding fails and the iteration decoding also stops.

In the present exemplary embodiment, the reliability information includes a log likelihood ratio (LLR). For example, each of the reliability information $L_1$ to $L_n$, $L_{i \to j}$ and $L_{j \to i}$ is one log likelihood ratio. In general, an absolute value of the log likelihood ratio (where the log likelihood ratio may be positive or negative) of one data bit being greater means that the reliability of such data bit is higher. In this case, the current value of such data bit has the higher probability of being deemed as correct. Conversely, when the absolute value of the log likelihood ratio of one data bit is smaller, it means that the reliability of such data bit is lower. In this case, the current value of such data bit has higher probability of being deemed as incorrect and will be corrected in the current iteration decoding. In an exemplary embodiment, the reliability information (e.g., the log likelihood ratio) used in the iteration decoding is obtained by looking up table. Further, in another exemplary embodiment, the reliability information used in the iteration decoding may also be dynamically generated through calculation according to a specific algorithm in the iteration decoding.

In the programming operation of the RNVM module 406 for the memory cells, if data to be programmed (i.e., data to be stored) is correct, the threshold voltages of the programmed memory cells may show a minor deviation due to varying wear degrees in different memory cells. As affected by this deviation, data subsequently read from such memory cells may include error. In general, such error has a high probability of being corrected by the decoding operation performed by the ECCC 508. For example, the ECCC 508 can effectively correct the error by slightly adjusting the RVL for reading such memory cells or executing the iteration decoding operation for a number of times.

Figure 11:
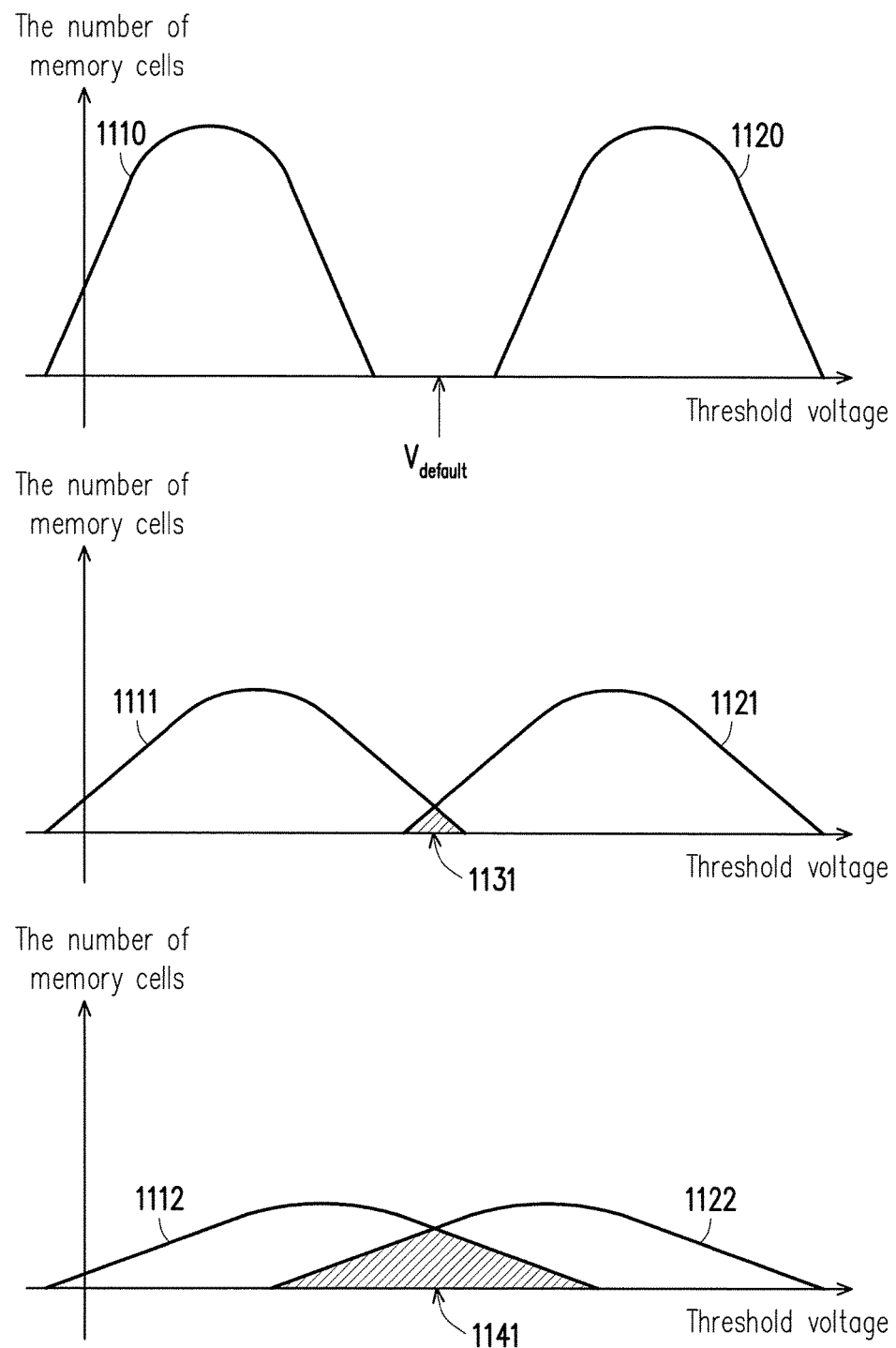
FIG. 11 is a schematic diagram illustrating variations in threshold voltage distributions of memory cells according to an exemplary embodiment of the invention.

FIG. 11 is a schematic diagram illustrating variations in threshold voltage distributions of memory cells according to an exemplary embodiment of the invention. With reference to FIG. 11, it is assumed that the wear degrees of a plurality of memory cells in the RNVM module 406 are very low (e.g., P/E counts of these memory cells are very small) at the beginning. As such, after the memory cells in the RNVM module 406 are programmed, the threshold voltages of a part of the programmed memory cells belong to a state 1110 and the threshold voltages of another part of the programmed memory cells belong to a state 1120. When it is intended to read the data stored by at least one memory cell among these memory cells, the MMC 502 sends one read command sequence to the RNVM module 406. Based on the read command sequence, the RNVM module 406 uses one (default) RVL $V_{default}$ to read these memory cells and transmits the obtained data bits to the MMC 502. In the example where each memory cell stores the bit data of one bit, if the threshold voltage of one specific memory cell is less than the RVL $V_{default}$ (e.g., the memory cell with the threshold voltage belonging to the state 1110), the MMC 502 may read the bit "1"; or, if the threshold voltage of one specific memory cell is greater than the RVL $V_{default}$ (e.g., the memory cell with threshold voltage belonging to the state 1120), the MMC 502 may read the bit "0".

However, with increases in usage time (e.g., the P/E counts are increased) of the RNVM module 406 and/or changes in an operating environment, a performance degradation may occur on the memory cells in the RNVM module 406. For example, after the performance degradation has occurred on the memory cells belonging to the states 1110 and 1120, the states 1110 and 1120 may gradually move close to each other or even overlap with each other. For example, a state 1111 and a state 1121 are used to represent the states 1110 and 1120 respectively after the performance degradation has occurred. Compared to the states 1110 and 1120, the states 1111 and 1121 include an overlap region 1131 (marked by slash lines).

After the performance degradation has occurred, if the same RVL $V_{default}$ is still used to read these memory cells, the read data bits may include many errors. For example, the errors include error bits due to the memory cells belonging to the state 1111 mistakenly determined as belonging to the state 1121, and/or the memory cells belonging to the state 1121 mistakenly determined as belonging to the state 1111. In an exemplary embodiment, the ECCC 508 performs a default decoding operation (a.k.a. the first default decoding operation) according to the obtained data bits so as to attempt correcting the errors in the data bits rapidly. In an exemplary embodiment, the first default decoding operation is also known as a hard-bit mode decoding operation, and the hard-bit mode decoding operation is used to decode the hard-bits being read.

Figure 12:
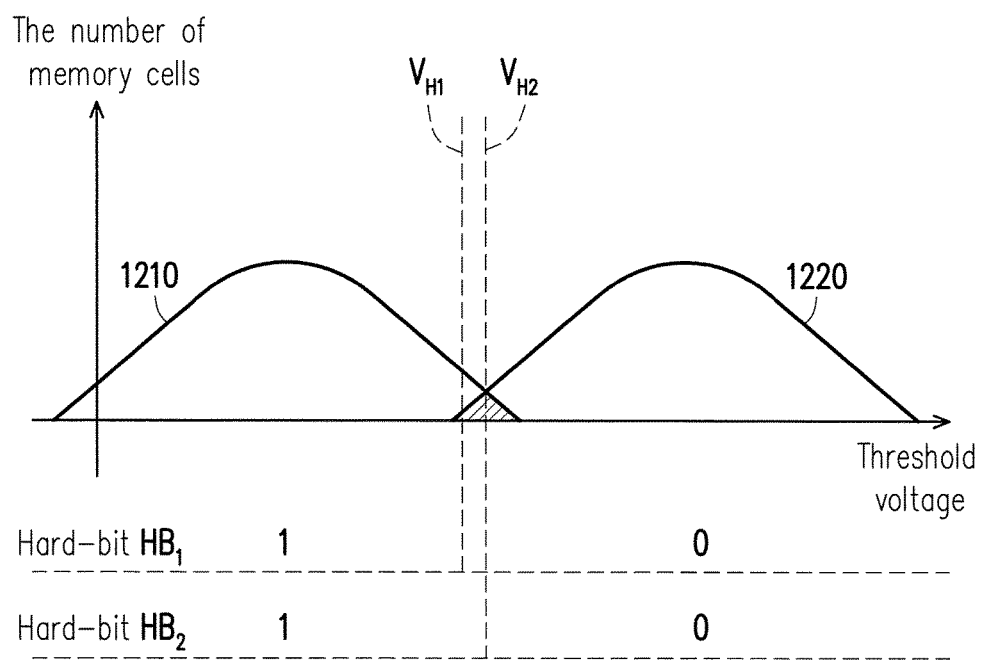
FIG. 12 is a schematic diagram illustrating a hard-bit mode decoding operation according to an exemplary embodiment of the invention.

FIG. 12 is a schematic diagram illustrating a hard-bit mode decoding operation according to an exemplary embodiment of the invention. With reference to FIG. 12, it is assumed that in the RNVM module 406, the threshold voltages of a part of the programmed memory cells belong to a state 1210 and the threshold voltages of another part of the programmed memory cells belong to a state 1220. When intending to read the data stored in these memory cells, the MMC 502 sends one read command sequence (hereinafter, also known as a hard-decision read command sequence) to the RNVM module 406. Based on the hard-decision read command sequence, the RNVM module 406 uses one hard-decision RVL (e.g., a RVL $V_{H1}$) to read these memory cells and transmits the obtained data bits (e.g., the hard-bits $HB_1$) to the MMC 502.

The ECCC 508 performs the hard-bit mode decoding operation according to the obtained hard-bits $HB_1$, so as to attempt correcting the possible errors existed in the hard-bits $HB_1$. If said errors are all corrected, it means that the decoding succeeds so the ECCC 508 then outputs successfully-decoded data. If the errors are not all corrected, it means that the decoding fails, the MMC 502 adjusts the hard-decision RVL (e.g., by adjusting the hard-decision RVL from the RVL $V_{H1}$ into a RVL $V_{H2}$) and sends another hard-decision read command sequence to the RNVM module 406. Based on that hard-decision read command sequence, the RNVM module 406 uses the RVL $V_{H2}$ to read these memory cells again and transmits the obtained data bits (e.g., hard-bits $HB_2$) to the MMC 502.

The ECCC 508 performs the hard-bit mode decoding operation again according to the obtained hard-bits $HB_2$, so as to attempt correcting the possible errors existed in the hard-bits $HB_2$. If said errors are all corrected, it means that the decoding succeeds so the ECCC 508 then outputs successfully-decoded data. In addition, if the errors are not all corrected, the MMC 502 can adjust the hard-decision RVL for reading these memory cells again and the hard-bit mode decoding operation can be performed multiple times.

Referring back to FIG. 11, for the memory cells with the threshold voltages belonging to the states 1111 and 1121, if these memory cells are continuously used, it is likely that the performance degradation may continuously occur on the memory cells. For example, the states 1111 and 1121 may be changed further into states 1112 and 1122. For example, the states 1112 and 1122 include one overlap region 1141 (marked by slash lines). An area of the overlap region 1141 is greater than an area of the overlap region 1131. Alternatively, a total number of the memory cells with the threshold voltages belonging to the overlap region 1141 is greater than a total number of the memory cells with the threshold voltages belonging to the overlap region 1131. At this time, as limited by a decoding capability (or an error correction capability) of the hard-bit mode decoding operation, no matter how many hard-decision RVLs are used to read the memory cells and how many times a hard decoding procedure is correspondingly performed, the errors may still not be completely corrected by the hard-bits of one-single reading.

In an exemplary embodiment, for the memory cells with the threshold voltages belonging to the states 1112 and 1122 (or similar distributions), the ECCC 508 performs another default decoding operation (a.k.a. a second default decoding operation) according to the obtained data bits, so as to attempt detecting the errors by using more information. In an exemplary embodiment, the second default decoding operation is also known as a soft-bit mode decoding operation, and the soft-bit mode decoding operation is used to decode soft-bits being read.

Figure 13:
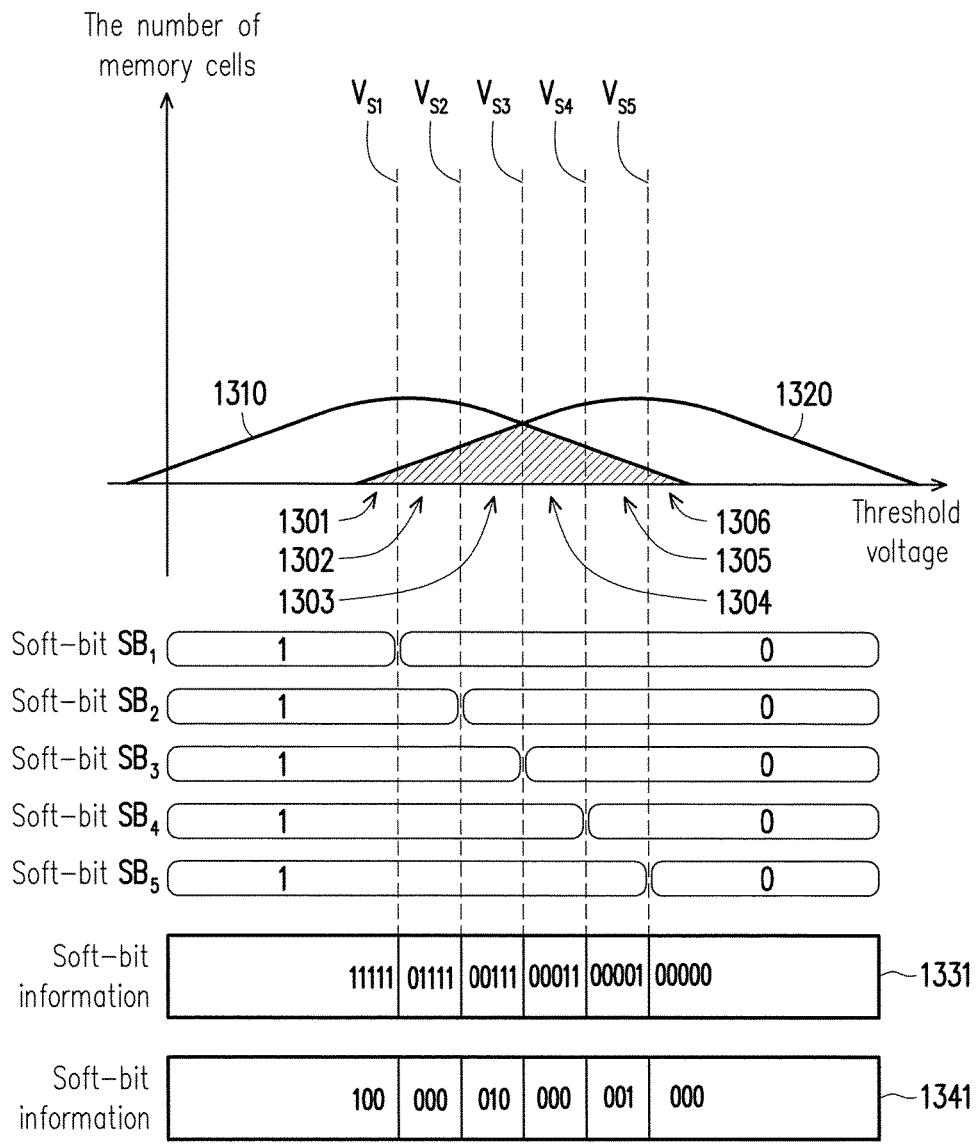
FIG. 13 is a schematic diagram illustrating a soft-bit mode decoding operation according to an exemplary embodiment of the invention.

FIG. 13 is a schematic diagram illustrating a soft-bit mode decoding operation according to an exemplary embodiment of the invention. With reference to FIG. 13, the MMC 502 sends one read command sequence (a.k.a. a soft-decision read command sequence) to the RNVM module 406. Based on the soft-decision read command sequence, the RNVM module 406 uses a plurality of RVLs $V_{S1}$ to $V_{S5}$ (a.k.a. soft-decision RVLs) to read these memory cells and transmits the obtained data bits (e.g., soft-bit information 1331) to the MMC 502. Here, the obtained soft-bit information 1331 includes a plurality of soft-bits $SB_1$ to $SB_5$ read from one specific memory cell.

In an exemplary embodiment, before transmitting the soft-bit information to the MMC 502, the RNVM module 406 performs a logical operation on at least part of the soft-bits corresponding to the same memory cell, so as to reduce a total number of the soft-bits to be transmitted. Taking FIG. 13 for example, the RNVM module 406 can perform a logical XOR (Exclusive OR) operation on the soft-bits $SB_2$ and $SB_3$ corresponding to one specific memory cell to obtain a first operation result, perform the logical XOR operation on the soft-bits $SB_4$ and $SB_5$ corresponding to that specific memory cell to obtain a second operation result, and transmits the soft-bit $SB_1$ of that specific memory cell, the first operation result and the second operation result as soft-bit information 1341 corresponding to that specific memory cell to the MMC 502. Among them, each of the first operation result and the second operation result may be regarded as one soft-bit. Compared to transmission of the soft-bit information 1331, the total number of the soft-bits contained by the soft-bit information 1341 is less, and thus the soft-bit information 1341 can be transmitted to the MMC 502 faster. In addition, the soft-bit information 1331 or 1341 may also be used to determine which one of voltage intervals 1301 to 1306 in FIG. 13 is the threshold voltage of one specific memory cell belonging to.

In an exemplary embodiment of FIG. 13, one of the RVLs $V_{S1}$ to $V_{S5}$ is set as a (plus-minus) sign RVL. The (plus-minus) sign RVL is used to determine the bit value of a data bit. For example, if the RVL $V_{S3}$ is the (plus-minus) sign RVL, the bit value of the data bit is identical to the bit value of the soft-bit $SB_3$; alternatively, if the RVL $V_{S2}$ is the (plus-minus) sign RVL, the bit value of the data bit is identical to the bit value of the soft-bit $SB_2$; and the rest may be deduced by analogy.

In an exemplary embodiment, according to the soft-bit information corresponding to one specific data bit, the ECCC 508 obtains the reliability information of that specific data bit. For example, in an exemplary embodiment of FIG. 13, if the soft-bit information corresponding to one specific data bit is "100", the ECCC 508 can look up a look-up table to obtain the log likelihood ratio corresponding to the voltage interval 1301. Such log likelihood ratio is regarded as the reliability information of that specific data bit. Then, the ECCC 508 performs the soft-bit mode decoding operation according to that specific data bit and the reliability information of that specific data bit. In addition, the reliability information of such data bit may also be updated at least once by looking up other look-up tables or by a dynamic generation in the soft-bit mode decoding operation. Details regarding the soft-bit mode decoding operation can refer to the exemplary embodiment of FIG. 10, which is not repeated hereinafter.

It is noted that, in view of the description regarding the hard-bit mode decoding operation and the soft-bit mode decoding operation above, if the errors in the data bits are simply generated due to the minor deviation occurred on the threshold voltages of the memory cells (e.g., the errors existing in the overlap regions 1131 or 1141 in FIG. 11), the ECCC 508 can effectively correct the errors by performing the hard-bit mode decoding operation or the soft-bit mode decoding operation. Taking FIG. 13 for example, if the threshold voltage of a memory cell corresponding to one specific data bit is closer to a V-shape between the states 1310 and 1320 (e.g., located within the voltage intervals 1303 or 1304), the absolute value of the log likelihood ratio assigned to such data bit may be smaller; conversely, if the threshold voltage of a memory cell corresponding to one specific data bit is farther from the V-shape between the states 1310 and 1320 (e.g., located within the voltage intervals 1301 or 1306), the absolute value of the log likelihood ratio assigned to such data bit may be greater.

In general, compared to the data bit with the absolute value of the log likelihood ratio being greater (e.g., 14), the data bit with the absolute value of the log likelihood ratio being smaller (e.g., 1) may be regarded more easily as the error bit so the bit value with the absolute value of the log likelihood ratio being smaller is more easily to be updated. Therefore, according to a distributed condition of the log likelihood ratio of the data bits, the errors in the data bits can be gradually corrected. However, based on practical experience, it is difficult to detect certain types of errors by the hard-bit mode decoding operation or soft-bit mode decoding operation in the conventional art.

Figure 14:
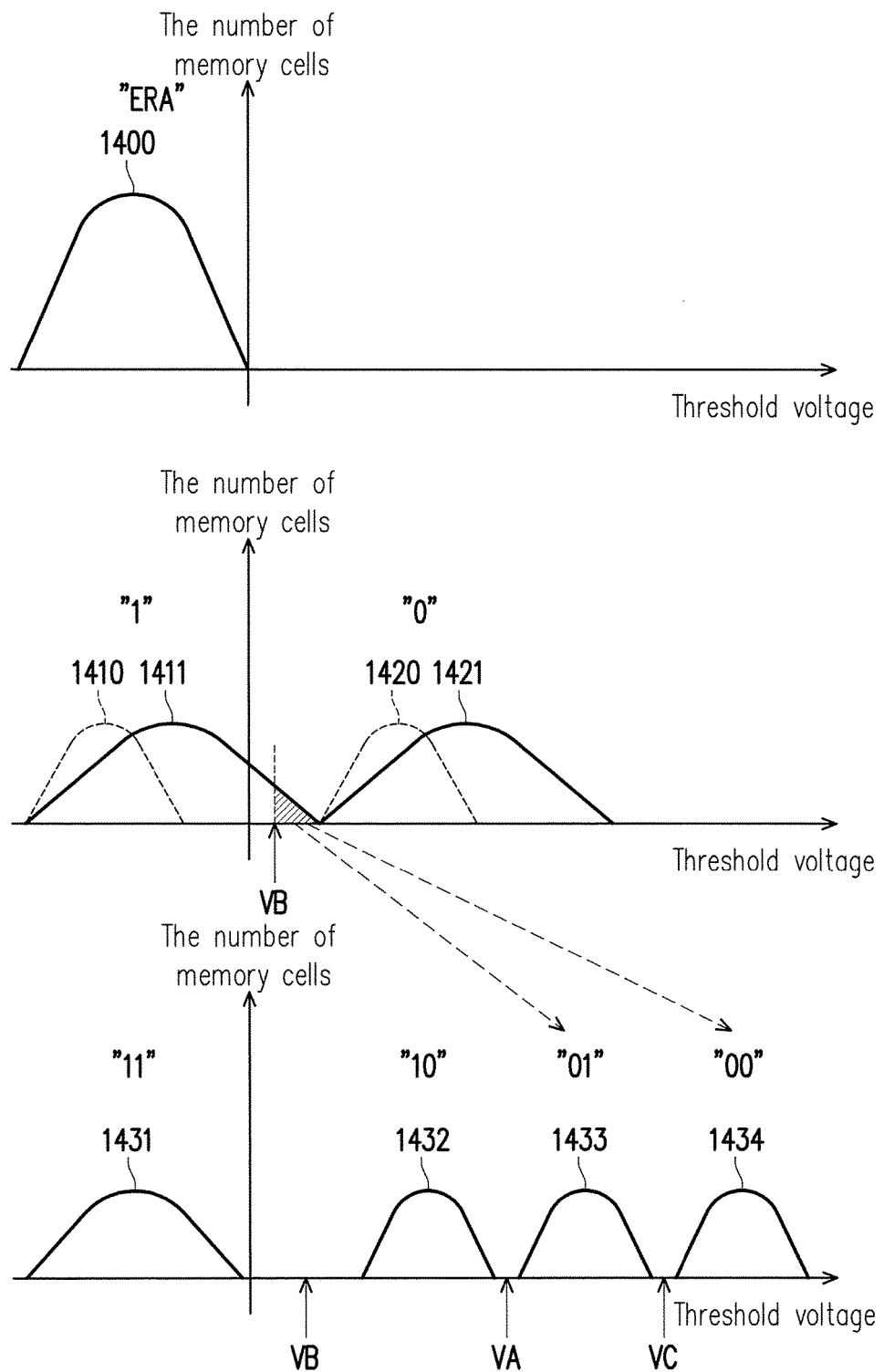
FIG. 14 illustrates a schematic diagram for programming memory cells according to an exemplary embodiment of the invention.

FIG. 14 illustrates a schematic diagram for programming memory cells according to an exemplary embodiment of the invention. It is noted that, an operating scenario of FIG. 14 may also be applied to the TLC NAND memory cells or other memory cells that can store two or more data bits by each memory cell. With reference to FIG. 14, it is assumed that the memory cells in the RNVM module 406 are the MLC NAND memory cells. Before these memory cells are programmed, the threshold voltages of these memory cells all belong to a state 1400. The memory cells belonging to the state 1400 may also be regarded as in an erase state "ERA". When these memory cells are programmed, one programming operation (a.k.a. a first programming operation) is first performed. In the first programming operation, electrons are injected into these memory cells. For example, the first programming operation may be regarded as to store a part of data into these memory cells.

After the first programming operation is completed, another programming operation (a.k.a. a second programming operation) is subsequently performed to inject more electrons into a part of the memory cells so as to complete the programming operation for these memory cells. It is noted that, the second programming operation is performed based on a programming result of the first programming operation. For example, before the second programming operation is performed, the data stored in each memory cell is read from the corresponding memory cell. Then, in the second programming operation, the read data and a part of not-yet stored data are simultaneously stored to the memory cells.

In an exemplary embodiment, each memory cell that the second programming operation is performed thereon is regarded as storing two data bits. Hereinafter, for descriptive convenience, each memory cell that the second programming operation is performed thereon is regarded as storing a first data bit and a second data bit, and the data read from a specific memory cell in order to perform the second programming operation is known as a third data bit. It is noted that, a bit value of the first data bit corresponds to the programming result of the first programming operation, and a bit value of the second data bit corresponds to a programming result of the second programming operation.

Referring back to FIG. 14, in an ideal state, the threshold voltages of the memory cells that the first programming operation is performed thereon belong to the states 1410 (e.g., each for storing the bit "1") or 1420 (e.g., each for storing the bit "0"). For example, the states 1410 and 1420 can be used to represent the programming result of the first programming operation. In correspondence to the states 1410 and 1420, if the RVL VB is used to read these memory cells, the data stored by these memory cells (i.e., the third data bit) can be correctly read. Based on the read third data bit, in the second programming operation for these memory cells, the threshold voltage of each memory cell is programmed to be in one of states 1431 to 1434. For example, if the third data bit read from one specific memory cell by using the RVL VB is the bit "1", after the second programming operation is performed on that specific memory cells, the threshold voltage of that specific memory cell belongs to the states 1431 or 1432 depending on the bit value of the second data bit to be stored to that specific memory cell. Alternatively, if the third data bit read from one specific memory cell by using the RVL VB is the bit "0", after the second programming operation is performed on that specific memory cells, the threshold voltage of that specific memory cell belongs to the states 1433 or 1434 depending on the bit value of the second data bit to be stored in that specific memory cell.

In the present exemplary embodiment, each memory cell with the threshold voltage belonging to the state 1431 is used to store the bit "11", where the bit values of the first data bit and the second data bit are both "1"; each memory cell with the threshold voltage belonging to the state 1432 is used to store the bit "10", where the bit values of the first data bit and the second data bit are "1" and "0" respectively; each memory cell with the threshold voltage belonging to the state 1433 is used to store the bit "01", where the bit values of the first data bit and the second data bit are "0" and "1" respectively; each memory cell with the threshold voltage belonging to the state 1434 is used to store the bit "00", where the bit values of the first data bit and the second data bit are both "0".

However, if the wear degree of the memory cells is actually higher, the threshold voltages of the memory cells that the first programming operation is performed thereon may belong to states 1411 (e.g., each for storing the bit "1") or 1421 (e.g., each for storing the bit "0"). For example, the states 1411 and 1421 can also be used to represent the programming result of the first programming operation. In correspondence to the states 1411 and 1421, if the RVL VB is used to read these memory cells before the second programming operation is performed, a part of the read third data bits may be incorrect. Based on the read incorrect third data bits, in the second programming operation, the memory cells that should be originally programmed to be in the state 1431 for storing the bit "11" may be incorrectly programmed to be in the state 1433 for storing the bit "01"; or, the memory cells that should be originally programmed to be in the state 1432 for storing the bit "10" may also be incorrectly programmed to be in the state 1434 for storing the bit "00". In other words, the bit values of the first data bits stored by part of the memory cells may be incorrect as affected by the incorrect third data bits.

For example, if the threshold voltage of one specific memory cell belongs to the slash region in the state 1411, the data stored by that specific memory cell is actually the bit "1" but the third data bit read from that specific memory cell according to the RVL VB is the bit "0" instead. Subsequently, in the second programming operation, based on the incorrect third data bit (i.e., the bit "0") and another data to be stored (e.g., the bit "1"), the threshold voltage of that specific memory cell may be incorrectly programmed to be in an error state (e.g., the state 1433). In other words, in this example, the threshold voltage of that specific memory cell should be programmed to be in the state 1431 in order to store the correct two data bits (e.g., the bit "11"). Rather, based on the read error data (e.g., the incorrect third data bit), the memory cell is incorrectly programmed to store the incorrect first data bit (e.g., the bit "0") and the correct second data bit (e.g., the bit "1"). Alternatively, in the second programming operation, based on the incorrect third data bit (e.g., the bit "0") and another data to be stored (e.g., the bit "0"), the threshold voltage of one memory cell may be incorrectly programmed to be in another error state (e.g., the state 1434). In general, because it is often hard to find the error caused by the second programming operation based on the error data (e.g., the incorrect third data bit) in the data to be decoded by adjusting the RVL (e.g., the RVLs VA or VC in FIG. 14) or using conventional decoding mechanism, the decoding operation is likely to fail.

In the present exemplary embodiment, the MMC 502 sends, to the RNVM module 406, one read command sequence (a.k.a. a first read command sequence), which is configured to instruct the RNVM module 406 to read a plurality of bits from a plurality of memory cells (a.k.a. first memory cells). For example, the read bits are the data bits. The ECCC 508 performs a decoding operation (a.k.a. a first decoding operation) on the bits according to the reliability information (a.k.a. first reliability information). If the first decoding operation fails and the first decoding operation meets one default condition, the ECCC 508 performs another decoding operation (a.k.a. a second decoding operation) on the bits according to another reliability information (a.k.a. second reliability information). It is noted that, the second reliability information is different from the first reliability information, and a correction ability of the second reliability information for a first type error of the bits is higher than a correction ability of the first reliability information for the first type error. In addition, the first type error refers to the error generated by performing aforesaid second programming operation on the first memory cells based on error data.

In an exemplary embodiment, the error data includes data obtained by reading at least one second memory cell in the RNVM module 406. In an exemplary embodiment, the second memory cell and the first memory cells refer to the same memory cell. For example, in an exemplary embodiment of FIG. 14, the error data includes the incorrect third data bit obtained by reading the first memory cells before the second programming operation is performed on the first memory cells. In addition, in another exemplary embodiment, the second memory cell does not belong to the first memory cells. That is to say, the second memory cell and the first memory cells refer to different memory cells. For example, during the process of moving data, the RNVM module 406 may read the error data from certain memory cells (i.e., the second memory cell) and store the error data to the other memory cells (i.e., the first memory cells) by the second programming operation to cause the first type error.

In an exemplary embodiment, if the RNVM module 406 supports (at least) two programming modes (e.g., a first programming mode and a second programming mode), the RNVM module 406 may program data (e.g., data from the host system 11) into the second memory cell by using the first programming mode in the first programming operation. Then, at a specific time point (e.g., when a data volume of the data stored by using the first programming mode reaches a default capacity), the RNVM module 406 reads the data from the second memory cells which are already programmed by using the first programming mode in the first programming operation, and switches to program the read data into the first memory cells by using the second programming mode in the second programming operation. In another exemplary embodiment, the data read from the second memory cells which are already programmed by using the first programming mode may also be regarded as the third data bit described above, and a bit value of the third data bit corresponds to the programming result of the first programming operation. In this case, if the data read according to the programming result of the first programming operation includes error (i.e., the incorrect third data bit is read), the error may also cause the first type error in the second programming operation.

In an exemplary embodiment, the first programming mode refers to one of a single layer memory cell (SLC) mode, a lower physical programming mode, a mixture programming mode and a less layer memory cell mode. In the single layer memory cell mode, one memory cell is only stored with data of one bit. In the lower physical programming mode, only the lower PPUs are programmed, and the upper PPUs corresponding to the lower PPUs may not be programmed. In the mixture programming mode, valid data (or real data) are programmed into the lower PPUs, and dummy data is programmed into the upper PPUs corresponding to the lower PPUs storing the valid data. In the less layer memory cell mode, one memory cell stores data with a first number of bits. For example, the first number may be "1".

In an exemplary embodiment, the second programming mode refers to a Multi level cell (MLC) programming mode, a Trinary level cell (TLC) programming mode or other similar modes. In the second programming mode, one memory cell is stored with data of a second number of bits, and the second number is equal to or greater than "2". For example, the second number may be 2 or 3. In another exemplary embodiment, the first number of the first programming mode and the second number of the second programming mode may be other numbers as long as the second number is greater than the first number.

In an exemplary embodiment where the second memory cell does not belong to the first memory cells, the states 1411 and 1421 in FIG. 14 may also be used to represent the programming result of the first programming operation performed on the second memory cells, and the states 1431 to 1434 in FIG. 14 may also be used to represent the programming result of the second programming operation performed on the first memory cells. Further, in an exemplary embodiment of FIG. 14, each of the first memory cells that the second programming operation is performed thereon may also store three or more data bits, which are not particularly limited by the invention.

In an exemplary embodiment, when the RNVM module 406 performs the garbage collection operation for collecting the valid data, the valid data read from a part of the memory cells may also be regarded as the said third data bit and may include the error data. When said valid data is stored back to the RNVM module 406, the first type error may also occur. For example, the valid data may be regarded as being collected from the second memory cell and stored back to the first memory cells.

In an exemplary embodiment, the first data bit and the second data bit are also known as a lower page bit and an upper page bit respectively. In an exemplary embodiment, the first type error (only) occurs in the lower page bit. For example, in a memory cell storing two or three bits, said lower page bit (or the first data bit) is the LSB or the bit belonging to the lower PPU.

In an exemplary embodiment, the first decoding operation and the second decoding operation are both the second default decoding operation (i.e., the soft-bit mode decoding operation) as mentioned in the exemplary embodiment of FIG. 13. In an exemplary embodiment, "the first decoding operation meets one default condition" refers to when a number of times the first decoding operation is performed reaches a default count, when a default number of the first reliability information (e.g., the log likelihood ratio) are used, and/or when the default number of look-up tables are looked up for obtaining the first reliability information. Furthermore, in an exemplary embodiment, "the first decoding operation meets one default condition" refers to when the look-up tables for obtaining the first reliability information are all used up.

In an exemplary embodiment, the first type error is also known as a high reliability error. If the data to be stored includes the error data (e.g., the incorrect third data bit) itself, after the memory cell is programmed by performing the second programming operation based on the error data, because the reliability of the data bit (e.g., the first data bit and/or the second data bit stored by using the second programming operation) read from that memory cell may be extremely high (e.g., the absolute value of the log likelihood ratio assigned for said data bit may be extremely large), such data bit may not be regarded as the error bit throughout the first decoding operation.

In one first decoding operation of an exemplary embodiment, one specific bit (a.k.a. a first bit) among the data bits to be decoded has a log likelihood ratio (a.k.a. a first log likelihood ratio). After determining that the first decoding operation fails and meets the default condition, the ECCC 508 assigns another log likelihood ratio (a.k.a. a second log likelihood ratio) to the first bit. It is noted that, an absolute value of the second log likelihood ratio is less than an absolute value of the first log likelihood ratio. Accordingly, in the second decoding operation, because the absolute value of the first bit becomes smaller, a probability of the first bit being regarded as the error bit may be increased. In an exemplary embodiment, if the first decoding operation fails because the data bit is not regarded as the error bit at all, it is likely that the second decoding operation may be successfully completed since the absolute value of the log likelihood ratio of the first bit is reduced in the second decoding operation.

In one first decoding operation of an exemplary embodiment, another bit (a.k.a. a second bit) among the data bits to be decoded also has a log likelihood ratio (a.k.a. a third log likelihood ratio). While assigning the second log likelihood ratio to the first bit, the ECCC 508 also assigns another log likelihood ratio (a.k.a. a fourth log likelihood ratio) to the second bit. An absolute value of the fourth log likelihood ratio is also less than an absolute value of the third log likelihood ratio. It is noted that, a difference value (a.k.a. a first difference value) exists between the absolute value of the first log likelihood ratio and the absolute value of the second log likelihood ratio, a difference value (a.k.a. a second difference value) also exists between the absolute value of the third log likelihood ratio and the absolute value of the fourth log likelihood ratio, and the first difference value is different from the second difference value. In other words, before one specific second decoding operation is performed, the ECCC 508 non-uniformly reduces the absolute values of the log likelihood ratios of different bits among the data bits to be decoded.

In an exemplary embodiment, in the operation of non-uniformly reducing the absolute values of the log likelihood ratios of the different bits among the data bits to be decoded, a reducing degree of the absolute value of the log likelihood ratio of one specific data bit is positively correlated to the absolute value of such log likelihood ratio. For example, if the current log likelihood ratio of one specific data bit is "−14", the log likelihood ratio of that specific data bit may be set as "−10" in the next second decoding operation. However, if the current log likelihood ratio of one specific data bit is "9", the log likelihood ratio of that specific data bit may be set as "7" in the next second decoding operation.

In an exemplary embodiment of FIG. 10, the operation of reducing the absolute value of the log likelihood ratio of an $i^{th}$ data bit may include (directly) adjusting at least one of the reliability information $L_i$, $L_{i \to j}$ and $L_{j \to i}$. It is noted that, the log likelihood ratio is only served as an example in some of the foregoing exemplary embodiments. In another exemplary embodiment, the reliability information may also include a parameter of other types, as long as a probability of the bit value of one specific bit being changed in the decoding operation can be affected by adjusting such parameter so as to increase the decoding efficiency for the first type error (i.e., the high reliability error).

In an exemplary embodiment, the adjustable reliability information further includes a convergence parameter. For example, in an exemplary embodiment of FIG. 10, such convergence parameter can be used for multiplying at least one of the reliability information $L_i$, $L_{i \to j}$ and $L_{j \to i}$ so as to change a value of at least one of the outputted reliability information $L_1$, $L_{i \to j}$ and $L_{j \to i}$. For example, the convergence parameter may be a positive number less than or equal to 1, such as 0.875, 0.625, 0.5 or 0.375.

In one first decoding operation of an exemplary embodiment, if a value of the currently used convergence parameter (a.k.a. a first convergence parameter) is 1, after determining that the first decoding operation fails and meets the default condition, the ECCC 508 uses another convergence parameter (a.k.a. a second convergence parameter). For example, a value of the second convergence parameter is 0.875. By reducing the convergence parameter, the absolute values of the log likelihood ratios of data bits may also be reduced.

In an exemplary embodiment, the second reliability information is dynamically generated based on the first reliability information. For example, before performing the second decoding operation, the ECCC 508 can dynamically generate new reliability information according to the first reliability information already assigned for one specific data bit in one first decoding operation. Then, in the second decoding operation, the ECCC 508 can assign this new reliability information for the data bit as the second reliability information of the data bit. In other words, in the exemplary embodiment where the second reliability information is dynamically generated, the second reliability information is not stored in the memory storage device 10 before the second decoding operation is performed by the ECCC 508.

In an exemplary embodiment, the second reliability information may also be recorded in at least one specific look-up table. In particular, the specific look-up table is not used in the first decoding operation. For example, the specific look-up table is a look-up table dedicated for solving the first type error.

It is noted that, in the foregoing exemplary embodiments, the second reliability information can be used to improve the correction ability for the first type error; however, for an error (a.k.a. a second type error) not generated by performing the programming operation on the first memory cells by the RNVM module 406 based on the error data, a correction ability of the second reliability information for the second type error is lower than a correction ability of the first reliability information for the second type error. More specifically, the second type error is, for example, an error bit obtained by reading the memory cells having the threshold voltages belonging to the overlap regions 1131 or 1141 in FIG. 11, or an error bit obtained by reading the memory cells in an overlap region (or nearby regions) between any two adjacent states among the states 1431 to 1434 in FIG. 14. Nonetheless, it is noted that, compared to the first type error, the second type error is stored (e.g., by the second programming operation) based on correct data rather than the error data.

For example, in an exemplary embodiment of FIG. 14, if one specific memory cell stores the bit "1" and has the threshold voltage not belonging to the slash region (e.g., the threshold voltage of that specific memory cell is less than the RVL VB), that specific memory cell is programmed to be in one of the states 1431 and 1432 by the second programming operation according to the correct third data bit (i.e., the bit "1") being read and another data to be stored. Thereafter, if the data bits read from that memory cell include errors (e.g., the incorrect first data bit and/or the incorrect second data bit), the errors are regarded as the second type error instead of the first type error. Similarly, if one specific memory cell is programmed to be in one of the states 1433 and 1434 by the second programming operation according to the correct third data bit (e.g., the bit "0") and another data to be stored, the errors in the data bits subsequently read from that specific memory cell are also regarded as the second type error instead of the first type error.

In an exemplary embodiment, the second reliability information is used for increasing the probability of some data bits with high reliability being regarded as the error bit. If the reliability of one specific data bit is overly high (e.g., the absolute value of the log likelihood ratio of the data bit is overly large), the decoding efficiency may also be reduced by assigning the second reliability information to the specific data bit. Accordingly, in an exemplary embodiment, the second reliability information is (only) used to perform the second decoding operation after all of the available first reliability information (or the available look-up tables) are used, so as to reduce a probability of false determination at the beginning of the decoding operation.

Figure 15:
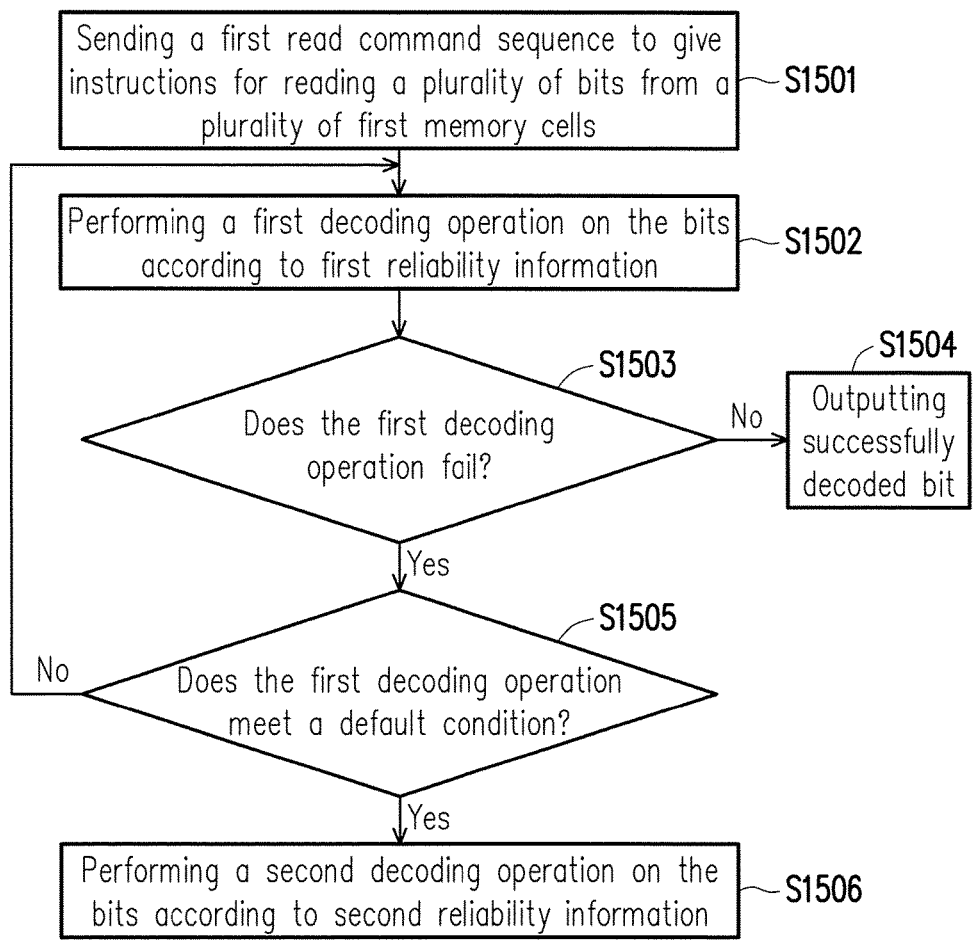
FIG. 15 is a flowchart illustrating a decoding method according to an exemplary embodiment of the invention.

FIG. 15 is a flowchart illustrating a decoding method according to an exemplary embodiment of the invention. With reference to FIG. 15, in step S1501, a first read command sequence is sent to give instructions for reading a plurality of bits from a plurality of first memory cells. In step S1502, a first decoding operation is performed on the bits according to first reliability information. In step S1503, whether the first decoding operation fails is determined. If the first decoding operation does not fail (i.e., succeeds), in step S1504, successfully decoded bit is outputted. If the first decoding operation fails, in step S1505, whether the first decoding operation meets a default condition is determined. If the first decoding operation does not meet the default condition, the method returns to step S1502, in which the first decoding operation is repeated according to the first reliability information. If the first decoding operation meets the default condition, in step S1506, a second decoding operation is performed on the bits according to second reliability information.

Figure 16:
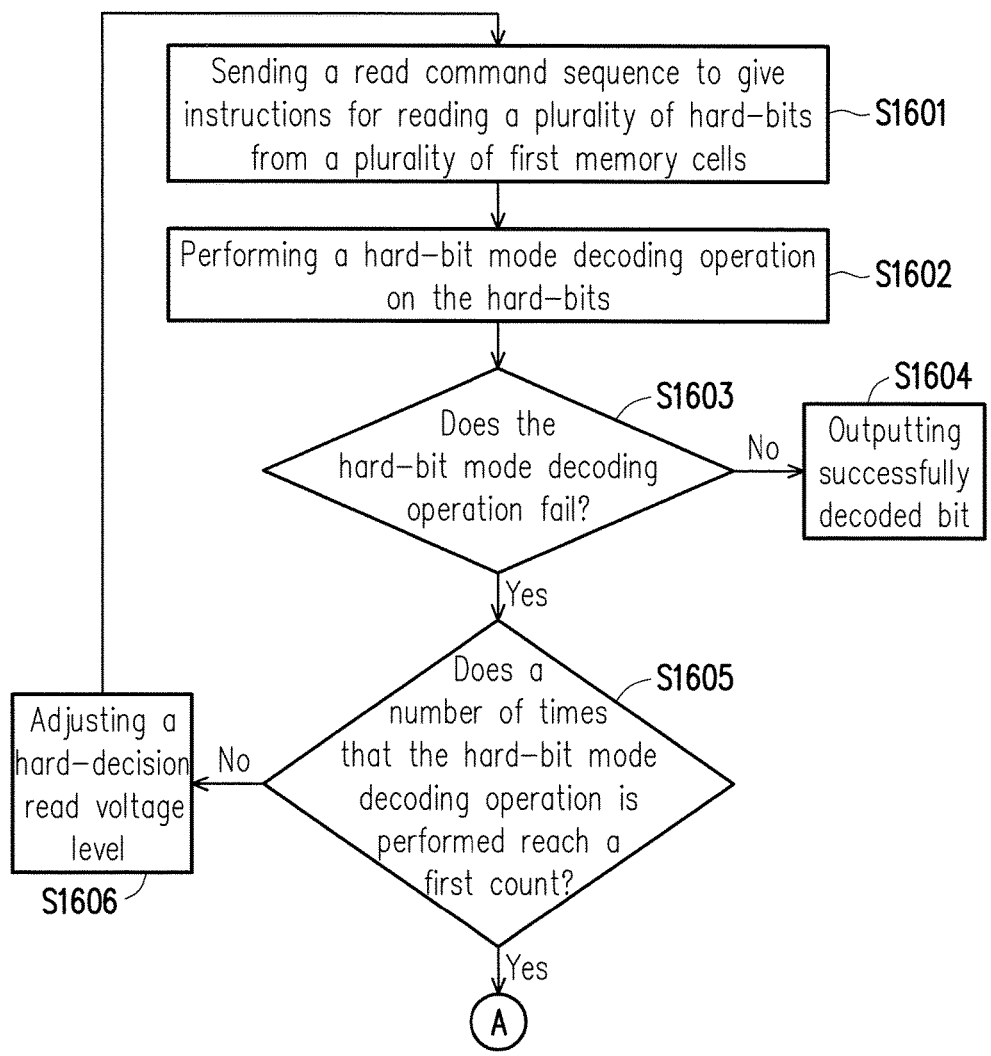
FIG. 16 to FIG. 18 are flowcharts illustrating a decoding method according to another exemplary embodiment of the invention.
Figure 17:
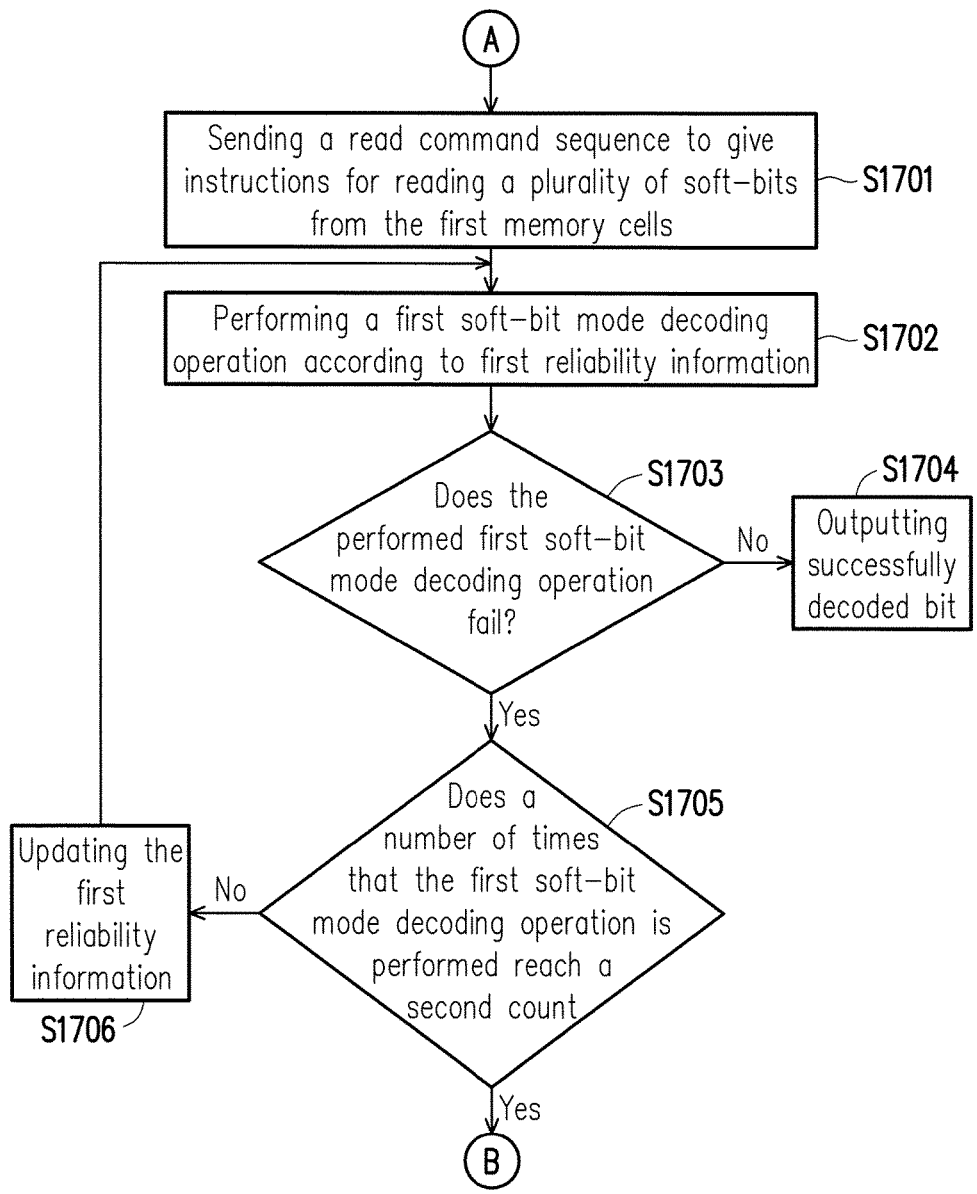
Figure 18:
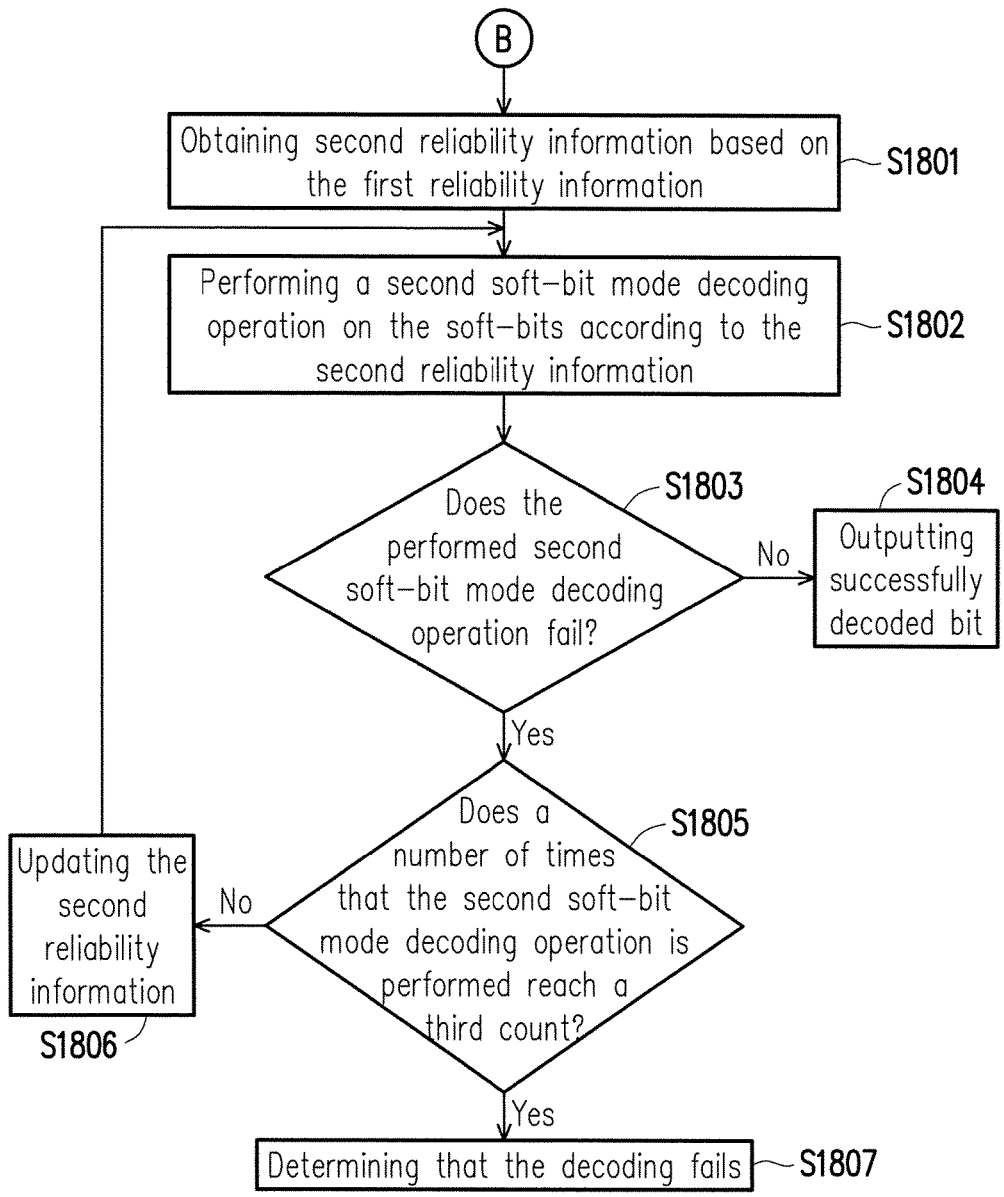

FIG. 16 to FIG. 18 are flowcharts illustrating a decoding method according to another exemplary embodiment of the invention. With reference to FIG. 16, in step S1601, a read command sequence is sent to give instructions for reading a plurality of hard-bits from a plurality of first memory cells. In step S1602, a hard-bit mode decoding operation is performed on the hard-bits. In step S1603, whether the hard-bit mode decoding operation fails is determined. If the performed hard-bit mode decoding operation does not fail (i.e., succeeds), in step S1604, successfully decoded bits are outputted. If the performed hard-bit mode decoding operation fails, in step S1605, whether a number of times the hard-bit mode decoding operation is performed reaches a first count is determined. If the number of times the hard-bit mode decoding operation is performed does not reach the first count, in step S1606, a hard-decision RVL is adjusted. Then, the method returns to step S1601, in which the first memory cells is re-read by using the adjusted hard-decision RVL to obtain new hard-bits. Subsequently, step S1602 is then performed. In addition, if the number of times the hard-bit mode decoding operation is performed reaches the first count, the method enters step S1701 in FIG. 17 after step S1605.

With reference to FIG. 17, in step S1701, a read command sequence is sent to give instructions for reading a plurality of soft-bits from the first memory cells. In step S1702, a first soft-bit mode decoding operation is performed according to first reliability information. In step S1703, whether the performed first soft-bit mode decoding operation fails is determined. If the performed first soft-bit mode decoding operation does not fail, in step S1704, successfully decoded bit is outputted. If the performed first soft-bit mode decoding operation fails, in step S1705, whether a number of times the first soft-bit mode decoding operation is performed reaches a second count is determined. If the number of times the first soft-bit mode decoding operation is performed does not reach the second count, in step S1706, the first reliability information is updated. Then, the method returns to step S1702, in which the first soft-bit mode decoding operation is repeated on the soft-bits according to the updated first reliability information. Subsequently, step S1703 is then performed. In addition, if the number of times the first soft-bit mode decoding operation is performed reaches the second count, the method enters step S1801 in FIG. 18 after step S1705.

With reference to FIG. 18, in step S1801, second reliability information is obtained based on the first reliability information. Furthermore, in another exemplary embodiment, the second reliability information may also be generated independently and unrelated to the first reliability information. In step S1802, a second soft-bit mode decoding operation is performed on the soft-bits according to the second reliability information. In step S1803, whether the performed second soft-bit mode decoding operation fails is determined. If the performed second soft-bit mode decoding operation does not fail, in step S1804, successfully decoded bit is outputted. If the performed second soft-bit mode decoding operation fails, in step S1805, whether a number of times the second soft-bit mode decoding operation is performed reaches a third count is determined. If the number of times the second soft-bit mode decoding operation is performed does not reach the second count, in step S1806, the second reliability information is updated. For example, in step S1806, the absolute value of the log likelihood ratio and/or the used convergence parameter of at least one specific data bit may be reduced. Then, the method returns to step S1802, in which the second soft-bit mode decoding operation is repeated on the soft-bits according to the updated second reliability information. Subsequently, step S1803 is then performed. Furthermore, if the number of times the second soft-bit mode decoding operation is performed reaches the third count, in step S1807, it is determined that the decoding fails.

Nevertheless, each of steps depicted in FIG. 15 to FIG. 18 have been described in detail as above, and thus related description is not repeated hereinafter. It is noted that, the steps depicted in FIG. 15 to FIG. 18 may be implemented as a plurality of program codes or circuits, which are not particularly limited in the invention. Moreover, the methods disclosed in FIG. 15 to FIG. 18 may be implemented with reference to above embodiments, or may be implemented separately, which are not particularly limited in the invention.

In summary, the decoding method, the memory storage device and the memory control circuit unit proposed in the invention are mainly a solution for improving the decoding efficiency for the memory cells configured to store two or more data bits. After the bits are read from the first memory cells, the first decoding operation is performed on the bits according to the first reliability information. If the first decoding operation fails and meets the default condition, it means that the bits may include the errors of specific types. For example, the errors of the specific type may include the first type error, which is generated by performing the programming operation on the first memory cells based on the error data. Accordingly, the second decoding operation is then performed on the bits according to the second reliability information, where the second reliability information is different from the first reliability information. In particular, the correction ability of the second reliability information for the first type error is higher than the correction ability of the first reliability information for the first type error. As a result, the decoding efficiency can be improved.

The previously described exemplary embodiments of the present disclosure have the advantages aforementioned, wherein the advantages aforementioned not required in all versions of the disclosure. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module comprising a plurality of memory cells, wherein the memory cells comprise a plurality of first memory cells, each memory cell among the first memory cells stores a first data bit and a second data bit, a bit value of the first data bit corresponds to a programming result of a first programming operation, a bit value of the second data bit corresponds to a programming result of a second programming operation, the second programming operation is performed based on the programming result of the first programming operation, and the decoding method comprises:
   sending a first read command sequence configured to instruct reading a plurality of bits from the first memory cells;
   performing a first decoding operation on the bits according to first reliability information;
   determining that an error in the bits is a first type error if the first decoding operation fails and the first decoding operation meets a default condition;
   determining that the error in the bits is a second type error if the first decoding operation fails and the first decoding operation does not meet the default condition; and
   performing a second decoding operation on the bits according to second reliability information,
   wherein the second reliability information is different from the first reliability information, and a correction ability of the second reliability information for a first type error of the bits is higher than a correction ability of the first reliability information for the first type error,
   wherein the first type error is generated by performing the second programming operation on the first memory cells based on error data,
   wherein a correction ability of the second reliability information for the second type error of the bits is lower than a correction ability of the first reliability information for the second type error,
   wherein the second type error is not generated by performing the second programming operation on the first memory cells based on the error data.

2. The decoding method according to claim 1, wherein the first reliability information comprises a first log likelihood ratio of a first bit among the bits, the second reliability information comprises a second log likelihood ratio of the first bit, and an absolute value of the second log likelihood ratio is less than an absolute value of the first log likelihood ratio.

3. The decoding method according to claim 2, wherein the first reliability information further comprises a third log likelihood ratio of a second bit among the bits, the second reliability information further comprises a fourth log likelihood ratio of the second bit, and an absolute value of the fourth log likelihood ratio is less than an absolute value of the third log likelihood ratio,
   wherein a first difference value exists between the absolute value of the first log likelihood ratio and the absolute value of the second log likelihood ratio, a second difference value exists between the absolute value of the third log likelihood ratio and the absolute value of the fourth log likelihood ratio, and the first difference value is different from the second difference value.

4. The decoding method according to claim 2, wherein a difference value between the absolute value of the first log likelihood ratio and the absolute value of the second log likelihood ratio is positively correlated to the absolute value of the first log likelihood ratio.

5. The decoding method according to claim 1, wherein the first reliability information comprises a first convergence parameter, and the second reliability information comprises a second convergence parameter, wherein a value of the first convergence parameter affects a probability of a bit value of a first bit among the bits being changed in the first decoding operation, a value of the second convergence parameter affects a probability of the bit value of the first bit being changed in the second decoding operation, and the second convergence parameter is different from the first convergence parameter.

6. The decoding method according to claim 1, wherein the step of performing the second decoding operation on the bits according to the second reliability information comprises:
dynamically generating the second reliability information based on the first reliability information.

7. The decoding method according to claim 1, wherein the second reliability information is not stored in a memory storage device before the second decoding operation is performed, wherein the memory storage device comprises the rewritable non-volatile memory module and an error checking and correcting circuit, and the first decoding operation and the second decoding operation are performed by the error checking and correcting circuit.

8. The decoding method according to claim 1, wherein the first programming operation is performed on at least one second memory cell among the memory cells, the second programming operation is performed on the first memory cells, and the at least one second memory cell does not belong to the first memory cells.

9. The decoding method according to claim 1, wherein the first programming operation and the second programming operation are both performed on the first memory cells.

10. A memory storage device, comprising:
a connection interface unit, configured to couple to a host system;
a rewritable non-volatile memory module, comprising a plurality of memory cells; and
a memory control circuit unit, coupled to the connection interface unit and the rewritable non-volatile memory module,
wherein the memory cells comprise a plurality of first memory cells, each memory cell among the first memory cells stores a first data bit and a second data bit, a bit value of the first data bit corresponds to a programming result of a first programming operation, a bit value of the second data bit corresponds to a programming result of a second programming operation, and the second programming operation is performed based on the programming result of the first programming operation,
wherein the memory control circuit unit is configured to send a first read command sequence configured to instruct reading a plurality of bits from the first memory cells,
wherein the memory control circuit unit is further configured to perform a first decoding operation on the bits according to first reliability information,
wherein the memory control circuit unit is further configured to determine that an error in the bits is a first type error if the first decoding operation fails and the first decoding operation meets a default condition,
wherein the memory control circuit unit is further configured to determine that the error in the bits is a second type error if the first decoding operation fails and the first decoding operation does not meet the default condition,
wherein the memory control circuit unit is further configured to perform a second decoding operation on the bits according to second reliability information, wherein the second reliability information is different from the first reliability information, and a correction ability of the second reliability information for a first type error of the bits is higher than a correction ability of the first reliability information for the first type error,
wherein the first type error is generated by performing the second programming operation on the first memory cells in the rewritable non-volatile memory module based on error data,
wherein a correction ability of the second reliability information for the second type error of the bits is lower than a correction ability of the first reliability information for the second type error,
wherein the second type error is not generated by performing the second programming operation on the first memory cells based on the error data.

11. The memory storage device according to claim 10, wherein the first reliability information comprises a first log likelihood ratio of a first bit among the bits, the second reliability information comprises a second log likelihood ratio of the first bit, and an absolute value of the second log likelihood ratio is less than an absolute value of the first log likelihood ratio.

12. The memory storage device according to claim 11, wherein the first reliability information further comprises a third log likelihood ratio of a second bit among the bits, the second reliability information further comprises a fourth log likelihood ratio of the second bit, and an absolute value of the fourth log likelihood ratio is less than an absolute value of the third log likelihood ratio,
wherein a first difference value exists between the absolute value of the first log likelihood ratio and the absolute value of the second log likelihood ratio, a second difference value exists between the absolute value of the third log likelihood ratio and the absolute value of the fourth log likelihood ratio, and the first difference value is different from the second difference value.

13. The memory storage device according to claim 11, wherein a difference value between the absolute value of the first log likelihood ratio and the absolute value of the second log likelihood ratio is positively correlated to the absolute value of the first log likelihood ratio.

14. The memory storage device according to claim 10, wherein the first reliability information comprises a first convergence parameter, and the second reliability information comprises a second convergence parameter,
wherein a value of the first convergence parameter affects a probability of a bit value of a first bit among the bits being changed in the first decoding operation, a value of the second convergence parameter affects a probability of the bit value of the first bit being changed in the second decoding operation, and the second convergence parameter is different from the first convergence parameter.

15. The memory storage device according to claim 10, wherein the operation of performing the second decoding operation on the bits according to the second reliability information by the memory control circuit unit comprises:
dynamically generating the second reliability information based on the first reliability information.

16. The memory storage device according to claim 15, wherein the second reliability information is not stored in the memory storage device before the second decoding operation is performed by the memory control circuit unit.

17. The memory storage device according to claim 10, wherein the first programming operation is performed on at least one second memory cell among the memory cells, the second programming operation is performed on the first memory cells, and the at least one second memory cell does not belong to the first memory cells.

18. A memory control circuit unit for controlling a rewritable non-volatile memory module comprising a plurality of memory cells, wherein the memory control circuit unit comprises:
a host interface, configured to couple to a host system;
a memory interface, configured to couple to the rewritable non-volatile memory module;
an error checking and correcting circuit; and
a memory management circuit, coupled to the host interface, the memory interface and the error checking and correcting circuit,
wherein the memory cells comprise a plurality of first memory cells, each memory cell among the first memory cells stores a first data bit and a second data bit, a bit value of the first data bit corresponds to a programming result of a first programming operation, a bit value of the second data bit corresponds to a programming result of a second programming operation, and the second programming operation is performed based on the programming result of the first programming operation,
wherein the memory management circuit is configured to send a first read command sequence configured to instruct reading a plurality of bits from the first memory cells,
wherein the error checking and correcting circuit is configured to perform a first decoding operation on the bits according to first reliability information,
wherein the error checking and correcting circuit is further configured to determine that an error in the bits is a first type error if the first decoding operation fails and the first decoding operation meets a default condition,
wherein the error checking and correcting circuit is further configured to determine that the error in the bits is a second type error if the first decoding operation fails and the first decoding operation does not meet the default condition,
wherein the error checking and correcting circuit is further configured to perform a second decoding operation on the bits according to second reliability information,
wherein the second reliability information is different from the first reliability information, and a correction ability of the second reliability information for a first type error of the bits is higher than a correction ability of the first reliability information for the first type error,
wherein the first type error is generated by performing the second programming operation on the first memory cells in the rewritable non-volatile memory module based on error data,
wherein a correction ability of the second reliability information for the second type error of the bits is lower than a correction ability of the first reliability information for the second type error,
wherein the second type error is not generated by performing the second programming operation on the first memory cells based on the error data.

19. The memory control circuit unit according to claim 18, wherein the first reliability information comprises a first log likelihood ratio of a first bit among the bits, the second reliability information comprises a second log likelihood ratio of the first bit, and an absolute value of the second log likelihood ratio is less than an absolute value of the first log likelihood ratio.

20. The memory control circuit unit according to claim 19, wherein the first reliability information further comprises a third log likelihood ratio of a second bit among the bits, the second reliability information further comprises a fourth log likelihood ratio of the second bit, and an absolute value of the fourth log likelihood ratio is less than an absolute value of the third log likelihood ratio,
wherein a first difference value exists between the absolute value of the first log likelihood ratio and the absolute value of the second log likelihood ratio, a second difference value exists between the absolute value of the third log likelihood ratio and the absolute value of the fourth log likelihood ratio, and the first difference value is different from the second difference value.

21. The memory control circuit unit according to claim 19, wherein a difference value between the absolute value of the first log likelihood ratio and the absolute value of the second log likelihood ratio is positively correlated to the absolute value of the first log likelihood ratio.

22. The memory control circuit unit according to claim 18, wherein the first reliability information comprises a first convergence parameter, and the second reliability information comprises a second convergence parameter,
wherein a value of the first convergence parameter affects a probability of a bit value of a first bit among the bits being changed in the first decoding operation, a value of the second convergence parameter affects a probability of the bit value of the first bit being changed in the second decoding operation, and the second convergence parameter is different from the first convergence parameter.

23. The memory control circuit unit according to claim 18, wherein the operation of performing the second decoding operation on the bits according to the second reliability information by the error checking and correcting circuit comprises:
dynamically generating the second reliability information based on the first reliability information.

24. The memory control circuit unit according to claim 18, wherein the second reliability information is not stored in a memory storage device before the second decoding operation is performed by the error checking and correcting circuit, wherein the memory storage device comprises the memory control circuit unit and the rewritable non-volatile memory module.

25. The memory control circuit unit according to claim 18, wherein the first programming operation is performed on at least one second memory cell among the memory cells, the second programming operation is performed on the first memory cells, and the second memory cell does not belong to the first memory cells.

* * * * *